US012763759B2

(12) United States Patent
Yu et al.

(10) Patent No.: US 12,763,759 B2
(45) Date of Patent: Oct. 13, 2026

(54) RAMP DRIVER AND ELECTRONIC DEVICE

(71) Applicants: Samsung Display Co., Ltd., Yongin-si (KR); IUCF-HYU (Industry-University Cooperation Foundation Hanyang University), Seoul (KR)

(72) Inventors: Byung Chang Yu, Yongin-si (KR); Kyung Hoon Chung, Yongin-si (KR); Oh Kyong Kwon, Seoul (KR); Youn Sik Kim, Seoul (KR); Sung Min Wee, Seoul (KR)

(73) Assignees: Samsung Display Co., Ltd., Yongin-si (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 0 days.

(21) Appl. No.: 19/244,911

(22) Filed: Jun. 20, 2025

(65) Prior Publication Data

US 2025/0392291 A1 Dec. 25, 2025

(30) Foreign Application Priority Data

Jun. 21, 2024 (KR) ........................ 10-2024-0081217
Aug. 8, 2024 (KR) ........................ 10-2024-0106081
May 30, 2025 (KR) ........................ 10-2025-0071232

(51) Int. Cl.
*G09G 3/3233* (2016.01)
*H03K 4/06* (2006.01)
(Continued)

(52) U.S. Cl.
CPC ............. *H03K 4/06* (2013.01); *G09G 3/3233* (2013.01); *H03K 5/01* (2013.01); *G09G 3/32* (2013.01);
(Continued)

(58) Field of Classification Search
None
See application file for complete search history.

(56) References Cited

U.S. PATENT DOCUMENTS 5,703,588 A 12/1997 Rivoir et al.
6,091,390 A 7/2000 Sim
(Continued)

FOREIGN PATENT DOCUMENTS

KR 10-2023232 B1 9/2019

OTHER PUBLICATIONS

US Office Action dated Mar. 18, 2026, issued in U.S. Appl. No. 19/209,661 (12 pages).
(Continued)

*Primary Examiner* — Krishna P Neupane
(74) *Attorney, Agent, or Firm* — Womble Bond Dickinson (US) LLP

(57) ABSTRACT

A ramp driver includes a ramp generator for generating a reference ramp signal, and a ramp delayer for sequentially outputting ramp signals based on the reference ramp signal, and including delay blocks including k output terminals, k being an integer greater than or equal to 2, wherein the delay blocks include k delay circuits sequentially connected to each other, respectively connected to the output terminals, and configured to receive an input ramp signal from a previous one of the delay circuits, receive an input gate clock signal from a previous delay circuit, output an output ramp signal by delaying the input ramp signal, and output an output gate clock signal by inverting the input gate clock signal.

20 Claims, 22 Drawing Sheets

(51) Int. Cl.
*H03K 5/01* (2006.01)
*G09G 3/32* (2016.01)
*H03K 5/00* (2006.01)

(52) U.S. Cl.
CPC ............... *G09G 2310/0291* (2013.01); *G09G 2320/064* (2013.01); *H03K 2005/00013* (2013.01)

(56) References Cited

U.S. PATENT DOCUMENTS

| | | | | |
|---|---|---|---|---|
| 6,842,135 | B2 | 1/2005 | Laflaquiere | |
| 9,917,272 | B2 | 3/2018 | Voges et al. | |
| 10,319,278 | B1 | 6/2019 | Nho et al. | |
| 10,789,900 | B2 | 9/2020 | Kim et al. | |
| 11,482,995 | B1 * | 10/2022 | Svorc | H02M 3/156 |
| 2003/0071666 | A1 | 4/2003 | Bailey | |
| 2004/0075634 | A1 | 4/2004 | Gates | |
| 2005/0041004 | A1 | 2/2005 | Gates et al. | |
| 2005/0067968 | A1 * | 3/2005 | Yamashita | G09G 3/3266 315/169.3 |
| 2007/0024544 | A1 | 2/2007 | Chung et al. | |
| 2007/0057884 | A1 | 3/2007 | Akai et al. | |
| 2008/0042738 | A1 | 2/2008 | Kang | |
| 2008/0204439 | A1 | 8/2008 | Morita | |
| 2009/0278865 | A1 | 11/2009 | Kang et al. | |
| 2010/0073572 | A1 | 3/2010 | Burns et al. | |
| 2011/0292261 | A1 | 12/2011 | Hwang et al. | |
| 2014/0036124 | A1 | 2/2014 | Hguchi et al. | |
| 2016/0013777 | A1 | 1/2016 | Duan et al. | |
| 2016/0097931 | A1 | 4/2016 | Takahota et al. | |
| 2018/0259904 | A1 | 9/2018 | Georgiou et al. | |
| 2020/0152134 | A1 | 5/2020 | Lee et al. | |
| 2022/0013070 | A1 * | 1/2022 | Ma | G09G 3/3275 |
| 2022/0254394 | A1 | 8/2022 | Shalmani et al. | |
| 2025/0201198 | A1 * | 6/2025 | Kwon | G09G 3/3233 |
| 2025/0391341 | A1 | 12/2025 | Yu et al. | |
| 2025/0392291 | A1 | 12/2025 | Yu et al. | |

OTHER PUBLICATIONS

US Notice of Allowance dated Aug. 11, 2026, issued in U.S. Appl. No. 19/209,661 (7 pages).

* cited by examiner

SG: SG[1], SG[2], SG[3], ..., SG[256]
Vsel: Vsel[1], Vsel[2], Vsel[3], ..., Vsel[256]

RAMP DRIVER AND ELECTRONIC DEVICE

CROSS-REFERENCE TO RELATED APPLICATIONS

The present application claims priority to, and the benefit of, Korean Patent Application No. 10-2024-0081217, filed on Jun. 21, 2024, Korean Patent Application No. 10-2024-0106081, filed on Aug. 8, 2024, Korean Patent Application No. 10-2025-0071232, filed on May 30, 2025, in the Korean Intellectual Property Office, the entire disclosures of which are incorporated herein by reference.

BACKGROUND

1. Field

The present disclosure relates to a ramp driver and an electronic device for providing a ramp signal to a sub-pixel.

2. Description of the Related Art

With the development of information technology, the importance of display devices as a connection medium between users and information is increasing. In response to this, the use of display devices, such as liquid crystal display devices, organic light-emitting display devices, inorganic light-emitting display devices, etc. is increasing.

Recently, there has been a lot of research on micro-LEDs, which have a faster response time and higher brightness compared to conventional LEDs. For inorganic light-emitting devices, such as micro LEDs, it is difficult to drive the pixels with pulse amplitude modulation (PAM) like organic light-emitting devices (organic LEDs). For example, the center wavelength of the current shifts with current density, which may make it difficult to achieve the desired luminance accurately. Therefore, for Micro LEDs, it is preferable to use a PWM (Pulse Width Modulation) method of driving the pixels, which expresses luminance by controlling the time that current flows through the light-emitting element.

SUMMARY

One aspect of the present disclosure provides a ramp driver that generates a ramp signal.

Another aspect of the present disclosure provides an electronic device including a ramp drive.

A ramp driver according to one or more embodiments of the present disclosure includes a ramp generator for generating a reference ramp signal, and a ramp delayer for sequentially outputting ramp signals based on the reference ramp signal, and including delay blocks including k output terminals, k being an integer greater than or equal to 2, wherein the delay blocks include k delay circuits sequentially connected to each other, respectively connected to the output terminals, and configured to receive an input ramp signal from a previous one of the delay circuits, receive an input gate clock signal from a previous delay circuit, output an output ramp signal by delaying the input ramp signal, and output an output gate clock signal by inverting the input gate clock signal.

An initial delay circuit among the delay circuits may be configured to generate the output ramp signal by delaying the reference ramp signal, and to generate the output gate clock signal by inverting a reference gate clock signal.

The delay blocks may include an error compensator for generating a compensation control signal by comparing the output ramp signal of a first delay circuit among the delay circuits in a corresponding delay block and the output ramp signal of a k-th delay circuit among the delay circuits in the corresponding delay block.

The error compensator may be configured to receive the reference gate clock signal.

The error compensator may be further configured to receive an invert gate clock signal, and may include an amplifier including a first input terminal, a second input terminal for receiving a reference voltage, and an output terminal, a first capacitor including a first electrode, and a second electrode connected to the first input terminal of the amplifier, a second capacitor including a first electrode connected to the first input terminal of the amplifier, and a second electrode connected to an output terminal of the amplifier, a first switch configured to be turned on in response to the invert gate clock signal, and including a first terminal connected to the first input terminal of the amplifier and a second terminal connected to the output terminal of the amplifier, a second switch configured to be turned on in response to the reference gate clock signal, and including a first terminal connected to a first input terminal of the error compensator, and a second terminal connected to the first electrode of the first capacitor, a third switch configured to be turned on in response to the invert gate clock signal, and including a first terminal connected to a second input terminal of the error compensator, and a second terminal connected to the first electrode of the first capacitor, a fourth switch configured to be turned on in response to the reference gate clock signal, and including a first terminal connected to the output terminal of the amplifier, and a second terminal connected to an output terminal of the error compensator, a comparator for outputting a comparison signal by comparing a signal of the first input terminal of the error compensator and a signal of the second input terminal of the error compensator, a first transistor including a control electrode for receiving the comparison signal, a first electrode for receiving a first predicted voltage, and a second electrode, a second transistor including a control electrode for receiving the comparison signal, a first electrode for receiving a second predicted voltage that is different from the first predicted voltage, and a second electrode, and a fifth switch configured to be turned on in response to the invert gate clock signal, and including a first terminal connected to the second electrode of the first transistor and to the second electrode of the second transistor, and a second terminal connected to the output terminal of the error compensator.

The delay circuits may include an amplifier, a sampling capacitor including a first electrode connected to a first input terminal of the amplifier, and a second electrode for receiving a ground voltage or the compensation control signal, an inverter for receiving the input gate clock signal, and for outputting the output gate clock signal, and a transmission gate connected between a delay circuit input terminal and the first input terminal of the amplifier, and configured to be controlled by the input gate clock signal and the output gate clock signal.

The amplifier may be configured to decrease a voltage at an output terminal of the amplifier based on a first bias voltage, and to increase the voltage at the output terminal of the amplifier based on a voltage at the first input terminal of the amplifier and a voltage at a second input terminal of the amplifier.

The amplifier may be configured to receive a first drive voltage, a second drive voltage, a first bias voltage, a second bias voltage, a third bias voltage, and a fourth bias voltage, and may include a first P-type transistor including a first electrode for receiving the first drive voltage, and a control electrode for receiving the fourth bias voltage, a second P-type transistor including a first electrode connected to a second electrode of the first P-type transistor, and a control electrode connected to the first input terminal of the amplifier, a third P-type transistor including a first electrode connected to the second electrode of the first P-type transistor, and a control electrode connected to a second input terminal of the amplifier, a fourth P-type transistor including a first electrode for receiving the first drive voltage, a fifth P-type transistor including a first electrode for receiving the first drive voltage, and a control electrode connected to a control electrode of the fourth P-type transistor, a sixth P-type transistor including a first electrode connected to a second electrode of the fourth P-type transistor, a second electrode connected to the control electrode of the fourth P-type transistor, and a control electrode for receiving the third bias voltage, a seventh P-type transistor including a first electrode connected to a second electrode of the fifth P-type transistor, and a control electrode for receiving the third bias voltage, an eighth P-type transistor including a first electrode for receiving the first drive voltage, a second electrode connected to an output terminal of the amplifier, and a control electrode connected to a second electrode of the seventh P-type transistor, a capacitor including a first electrode connected to a second electrode of the fifth P-type transistor, and a second electrode connected to the output terminal of the amplifier, and a first N-type transistor including a first electrode connected to the second electrode of the third P-type transistor, a second electrode for receiving the second drive voltage, and a control electrode for receiving the first bias voltage, a second N-type transistor including a first electrode connected to a second electrode of the second P-type transistor, a second electrode for receiving the second drive voltage, and a control electrode for receiving the first bias voltage, a third N-type transistor including a first electrode connected to the control electrode of the fourth P-type transistor, a second electrode connected to a second electrode of the third P-type transistor, and a control electrode for receiving the second bias voltage, a fourth N-type transistor including a first electrode connected to the control electrode of the eighth P-type transistor, a second electrode connected to a second electrode of the second P-type transistor, and a control electrode for receiving the second bias voltage, and a fifth N-type transistor including a first electrode connected to the output terminal of the amplifier, a second electrode for receiving the second drive voltage, and a control electrode for receiving the first bias voltage.

The ramp generator may include a resistor string between a first terminal for receiving a high ramp voltage and a second terminal for receiving a low ramp voltage, wherein the resistor string partitions the high ramp voltage into first to p-th voltages, p being a positive integer, and wherein the ramp generator is configured to output the first to p-th voltages sequentially to generate the reference ramp signal.

The ramp generator may further include stages including a flip-flop for outputting a ramp control signal, a ramp switch including a first terminal connected to a corresponding first resistive element of the resistor string, and a second terminal connected to an output terminal of the ramp generator, and a level shifter for turning on the ramp switch upon receiving the ramp control signal.

An electronic device according to one or more embodiments of the present disclosure includes a processor for providing an image data, and a display device for displaying an image based on the image data, and including a display panel including pixels, and a ramp driver for generating ramp signals provided to the pixels, and including a ramp generator for generating a reference ramp signal, and a ramp delayer for sequentially outputting the ramp signals based on the reference ramp signal, and including delay blocks including k output terminals, k being an integer greater than or equal to 2, wherein the delay blocks include k delay circuits sequentially connected to each other, respectively connected to the output terminals, and configured to receive an input ramp signal from a previous one of the delay circuits, receive an input gate clock signal from a previous delay circuit, output an output ramp signal by delaying the input ramp signal, and output an output gate clock signal by inverting the input gate clock signal.

An initial delay circuit among the delay circuits may be configured to generate the output ramp signal by delaying the reference ramp signal, wherein the initial delay circuit is configured to generate the output gate clock signal by inverting a reference gate clock signal.

The delay blocks may include an error compensator for generating a compensation control signal by comparing the output ramp signal of a first delay circuit among the delay circuits in a corresponding delay block and the output ramp signal of a k-th delay circuit among the delay circuits in the corresponding delay block.

The error compensator may be configured to receive the reference gate clock signal.

The error compensator may be further configured to receive an invert gate clock signal, and may include an amplifier including a first input terminal, a second input terminal for receiving a reference voltage, and an output terminal, a first capacitor including a first electrode, and a second electrode connected to the first input terminal of the amplifier, a second capacitor including a first electrode connected to the first input terminal of the amplifier, and a second electrode connected to an output terminal of the amplifier, a first switch configured to be turned on in response to the invert gate clock signal, and including a first terminal connected to the first input terminal of the amplifier, and a second terminal connected to the output terminal of the amplifier, a second switch configured to be turned on in response to the reference gate clock signal, and including a first terminal connected to a first input terminal of the error compensator, and a second terminal connected to the first electrode of the first capacitor, a third switch configured to be turned on in response to the invert gate clock signal, and including a first terminal connected to a second input terminal of the error compensator, and a second terminal connected to the first electrode of the first capacitor, a fourth switch configured to be turned on in response to the reference gate clock signal, including a first terminal connected to the output terminal of the amplifier, and a second terminal connected to an output terminal of the error compensator, a comparator for outputting a comparison signal by comparing a signal of the first input terminal of the error compensator and a signal of the second input terminal of the error compensator, a first transistor including a control electrode for receiving the comparison signal, a first electrode for receiving a first predicted voltage, and a second electrode, a second transistor including a control electrode for receiving the comparison signal, a first electrode for receiving a second predicted voltage that is different from the first predicted voltage, and a second electrode, and a fifth switch configured to be turned on in response to the invert gate clock signal, and including a first terminal connected to the second electrode of the first transistor and to the second electrode of the second transistor, and a second terminal connected to the output terminal of the error compensator.

The delay circuits may include an amplifier, a sampling capacitor including a first electrode connected to a first input terminal of the amplifier, and a second electrode for receiving a ground voltage or the compensation control signal, an inverter for receiving the input gate clock signal, and for outputting the output gate clock signal inverted from the input gate clock signal, and a transmission gate connected between a delay circuit input terminal and the first input terminal of the amplifier, and configured to be controlled by the input gate clock signal and the output gate clock signal.

The amplifier may be configured to decrease a voltage at an output terminal of the amplifier based on a first bias voltage, and to increase the voltage at the output terminal of the amplifier based on a voltage at the first input terminal of the amplifier and a voltage at a second input terminal of the amplifier.

The amplifier may be configured to receive a first drive voltage, a second drive voltage, a first bias voltage, a second bias voltage, a third bias voltage, and a fourth bias voltage, and may include a first P-type transistor including a first electrode for receiving the first drive voltage, and a control electrode for receiving the fourth bias voltage, a second P-type transistor including a first electrode connected to a second electrode of the first P-type transistor, and a control electrode connected to the first input terminal of the amplifier, a third P-type transistor including a first electrode connected to the second electrode of the first P-type transistor, and a control electrode connected to a second input terminal of the amplifier, a fourth P-type transistor including a first electrode for receiving the first drive voltage, a fifth P-type transistor including a first electrode for receiving the first drive voltage, and a control electrode connected to a control electrode of the fourth P-type transistor, a sixth P-type transistor, a first electrode connected to a second electrode of the fourth P-type transistor, a second electrode connected to the control electrode of the fourth P-type transistor, and a control electrode for receiving the third bias voltage, a seventh P-type transistor including a first electrode connected to a second electrode of the fifth P-type transistor, and a control electrode for receiving the third bias voltage, an eighth P-type transistor including a first electrode for receiving the first drive voltage, a second electrode connected to an output terminal of the amplifier, and a control electrode connected to a second electrode of the seventh P-type transistor, a capacitor including a first electrode connected to a second electrode of the fifth P-type transistor, and a second electrode connected to the output terminal of the amplifier, and a first N-type transistor including a first electrode connected to a second electrode of the third P-type transistor, a second electrode for receiving the second drive voltage, and a control electrode for receiving the first bias voltage, a second N-type transistor including a first electrode connected to a second electrode of the second P-type transistor, a second electrode for receiving the second drive voltage, and a control electrode for receiving the first bias voltage, a third N-type transistor including a first electrode connected to a control electrode of the fourth P-type transistor, a second electrode connected to a second electrode of the third P-type transistor, and a control electrode for receiving the second bias voltage, a fourth N-type transistor including a first electrode connected to the control electrode of the eighth P-type transistor, a second electrode connected to a second electrode of the second P-type transistor, and a control electrode for receiving the second bias voltage, and a fifth N-type transistor including a first electrode connected to the output terminal of the amplifier, a second electrode for receiving the second drive voltage, and a control electrode for receiving the first bias voltage.

The ramp generator may include a resistor string between a first terminal for receiving a high ramp voltage, and a second terminal for receiving a low ramp voltage, wherein the resistor string partitions the high ramp voltage into first to p-th voltages, wherein p is a positive integer, and wherein the ramp generator is configured to output the first to p-th voltages sequentially to generate the reference ramp signal.

The ramp generator may further include stages, the stages including a flip-flop for outputting a ramp control signal, a ramp switch including a first terminal connected to a corresponding first resistive element of the resistor string, and a second terminal connected to an output terminal of the ramp generator, and a level shifter for turning on the ramp switch upon receiving the ramp control signal.

The ramp driver according to embodiments of the present disclosure may generate a ramp signal to drive the sub-pixel in a PWM manner via a resistor string, and/or may generate a ramp signal to drive the sub-pixel in a PWM manner via a ramp transistor.

However, the aspects of the present disclosure are not limited to the aspects described above and may be extended in various ways without departing from the spirit and scope of the present disclosure.

DETAILED DESCRIPTION

Figure 1:
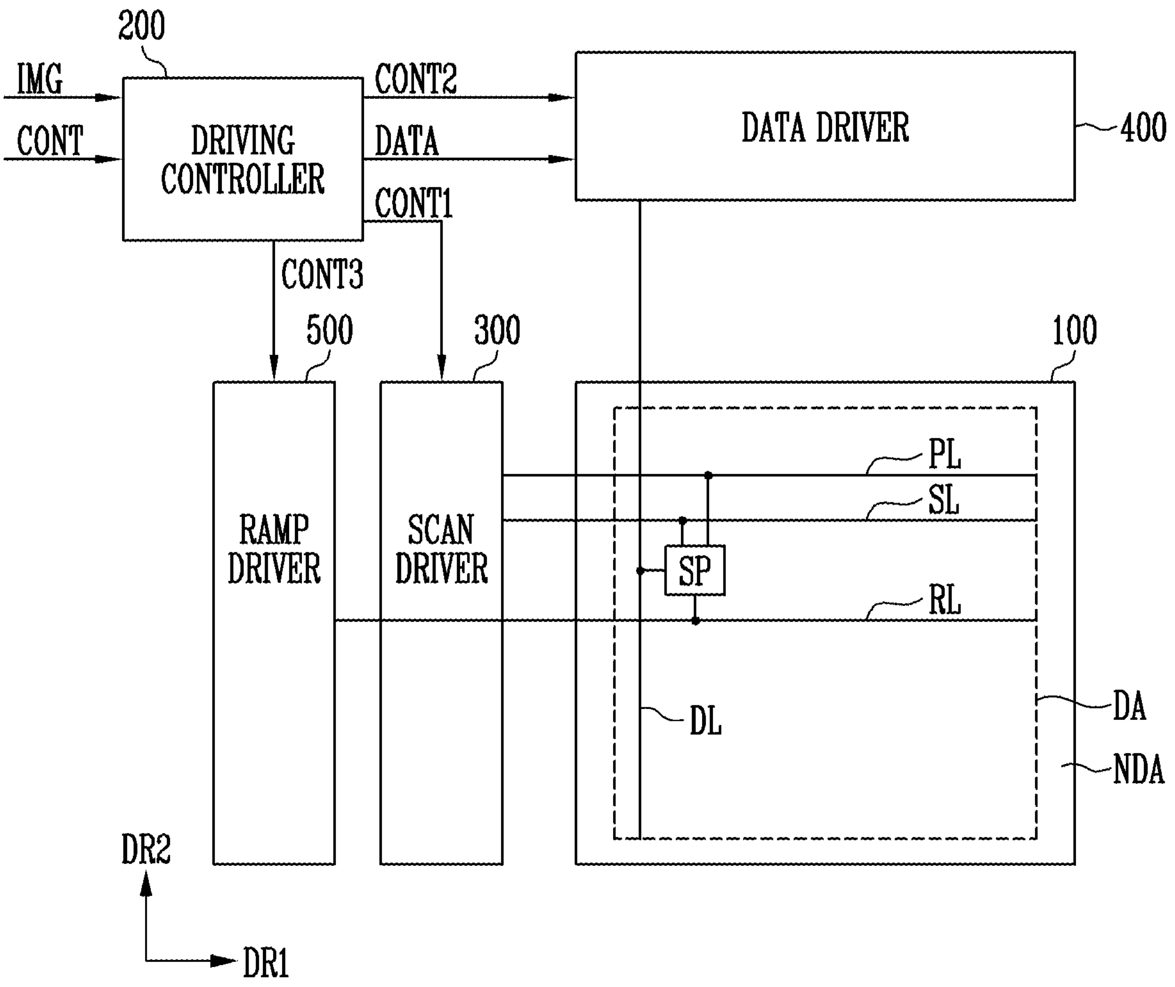
FIG. 1 is a block diagram illustrating a display device according to embodiments of the present disclosure.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure.

A person of ordinary skill in the art would appreciate, in view of the present disclosure in its entirety, that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

In the drawings, the relative sizes of elements, layers, and regions may be exaggerated for clarity and/or descriptive purposes. In other words, because the sizes and thicknesses of elements in the drawings are arbitrarily illustrated for convenience of description, the disclosure is not limited thereto. Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

Further, the phrase "in a plan view" means when an object portion is viewed from above, and the phrase "in a schematic cross-sectional view" means when a schematic cross-section taken by vertically cutting an object portion is viewed from the side.

It will be understood that when an element, layer, region, or component (e.g., an apparatus, a device, a circuit, a wire, an electrode, a terminal, a conductive film, etc.) is referred to as being "formed on," "on," "connected to," or "(operatively, functionally, or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection.

For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a transistor, a resistor, an inductor, a capacitor, a diode and/or the like. Accordingly, a connection is not limited to the connections illustrated in the drawings or the detailed description and may also include other types of connections. In describing embodiments, an expression of connection indicates electrical connection unless explicitly described to be direct connection, and "directly connected/directly coupled," or "directly on," refers to one component directly connecting or coupling another component, or being on another component, without an intermediate component.

Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XY, YZ, and XZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list. When "C to D" is stated, it means C or more and D or less, unless otherwise specified.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are only used to distinguish one element, member, component, region, area, layer, section, or portion from another element, member, component, region, area, layer, section, or portion. Thus, a first element, component, region, layer, or section described below could be termed a second element, component, region, layer, or section, without departing from the spirit and scope of the present disclosure. The description of an element as a “first” element may not require or imply the presence of a second element or other elements. The terms “first,” “second,” etc. may also be used herein to differentiate different categories or sets of elements. For conciseness, the terms “first,” “second,” etc. may represent “first-category (or first-set),” “second-category (or second-set),” etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms “a” and “an” are intended to include the plural forms as well, while the plural forms are also intended to include the singular forms, unless the context clearly indicates otherwise. It will be further understood that the terms “comprises,” “comprising,” “have,” “having,” “includes,” and “including,” when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the terms “substantially,” “about,” “approximately,” and similar terms are used as terms of approximation and not as terms of degree, and are intended to account for the inherent deviations in measured or calculated values that would be recognized by those of ordinary skill in the art. For example, “substantially” may include a range of +/−5% of a corresponding value. “About” or “approximately,” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value. Further, the use of “may” when describing embodiments of the present disclosure refers to “one or more embodiments of the present disclosure.” Furthermore, the expression “being the same” may mean “being substantially the same.” In other words, the expression “being the same” may include a range that can be tolerated by those of ordinary skill in the art. The other expressions may also be expressions from which “substantially” has been omitted.

In some embodiments well-known structures and devices may be described in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to embodiments of the present disclosure.

Referring to FIG. 1, a display device may comprise a display panel 100, a driving controller 200, a scan driver 300, a data driver 400, and a ramp driver 500. In one or more embodiments, the driving controller 200, the data driver 400, and the ramp driver 500 may be integrated on a single chip.

The display panel 100 may comprise a display area DA that displays an image, and a non-display area NDA adjacently located to the display area DA. In one or more embodiments, at least one of the scan driver 300 or the ramp driver 500 may be mounted in the non-display area NDA.

The display panel 100 may comprise a plurality of scan lines SL, a plurality of power lines PL, a plurality of data lines DL, a plurality of ramp lines RL, and a plurality of sub-pixels SP. The plurality of sub-pixels SP may be electrically connected to the scan lines SL, power lines PL, data lines DL, and ramp lines RL. The scan lines SL, power lines PL, and ramp lines RL may extend in a first direction DR1, and the data lines DL may extend in a second direction DR2 crossing the first direction DR1.

The driving controller 200 may receive input image data IMG and input control signals CONT from a main processor (e.g., an application processor, a graphics processor, a microprocessor, a central processing unit (CPU), etc.). For example, the input image data IMG may comprise red image data, green image data, and blue image data. In one or more embodiments, the input image data IMG may further comprise white image data. In another example, the input image data IMG may comprise magenta image data, yellow image data, and cyan image data. The input control signal CONT may comprise a master clock signal and a data enable signal.

The input control signal CONT may further comprise a vertical synchronization signal and a horizontal synchronization signal.

The driving controller 200 may generate a first control signal CONT1, a second control signal CONT2, a third control signal CONT3, and a data signal DATA based on the input image data IMG and the input control signal CONT.

The driving controller 200 may generate a first control signal CONT1 for controlling the operation of the scan driver 300 based on the input control signal CONT and output it to the scan driver 300. The first control signal CONT1 may comprise a vertical start signal and a gate clock signal.

Based on the input control signal CONT, the driving controller 200 may generate a second control signal CONT2 for controlling the operation of the data driver 400 and output it to the data driver 400. The second control signal CONT2 may comprise a horizontal start signal and a load signal.

The driving controller 200 may generate a third control signal CONT3 based on the input control signal CONT to control the operation of the ramp driver 500 and output it to the ramp driver 500. The third control signal CONT3 may comprise a vertical start signal vst (see FIG. 7), a ramp clock signal rclk (see FIG. 7), a gate clock signal gclk, (see FIG. 9), and an invert gate clock signal gclkb (see FIG. 9).

The driving controller 200 may receive the input image data IMG and the input control signal CONT to generate a data signal DATA. The driving controller 200 may output the data signal DATA to the data driver 400.

The scan driver 300 may generate scan signals for providing to the scan lines SL, and power voltages for providing to the power lines PL, in response to the first control signal CONT1 input from the driving controller 200. The scan driver 300 may output the scan signals to the scan lines SL. The scan driver 300 may output power voltages to the power lines PL. For example, the scan driver 300 may sequentially output the scan signals to the scan lines SL and the power voltages to the power lines PL.

In one or more embodiments, the scan driver 300 provides scan signals and power supply voltages, but the present disclosure is not limited thereto. For example, the scan driver 300 may provide the scan signals, and circuitry separate from the scan driver 300 may provide the power voltages.

In one or more embodiments, power voltages are provided to each row of pixels via power lines PL, but the present disclosure is not limited to thereto. For example, the same power supply voltage may be applied to all sub-pixels SP, and the power supply voltage may be provided from separate circuits.

The data driver 400 may receive a second control signal CONT2 and a data signal DATA from the driving controller 200. The data driver 400 may generate data voltages by converting the data signal DATA to an analog form of voltage. The data driver 400 may output the data voltages to the data lines DL.

The ramp driver 500 may generate ramp signals (RAMP[1], RAMP[2], RAMP[3], . . . ) (see FIG. 12) for providing to the ramp lines RL in response to the third control signal CONT3 input from the driving controller 200. The ramp driver 500 may output the ramp signals to the ramp lines RL. For example, the ramp driver 500 May sequentially output the ramp signals to the ramp lines RL.

Figure 2:
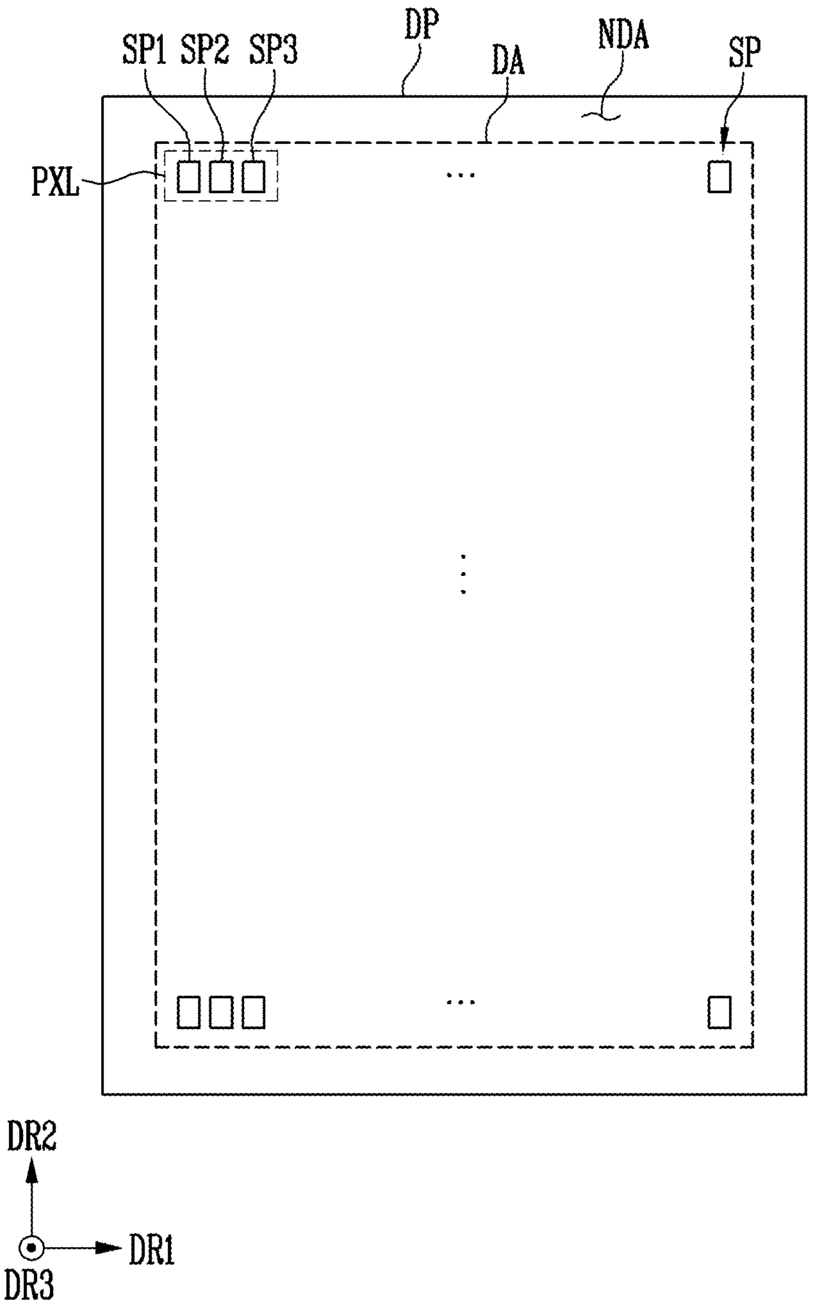
FIG. 2 is a plan view illustrating one or more embodiments of the display panel of FIG. 1.

FIG. 2 is a plan view illustrating one or more embodiments of the display panel of FIG. 1.

Referring to FIG. 2, the display panel DP may comprise a display area DA and a non-display area NDA. The display panel DP displays images through the display area DA. The non-display area NDA is located around the periphery of the display area DA.

The display panel DP comprises sub-pixels SP in the display area DA. The sub-pixels SP may be arranged along a first direction DR1, and along a second direction DR2 crossing the first direction DR1. For example, the sub-pixels SP may be arranged in a matrix along the first direction DR1 and the second direction DR2. As another example, the sub-pixels SP may be arranged in a zigzag pattern along the first direction DR1 and the second direction DR2. The arrangement of the sub-pixels SP may vary according to embodiments. The first direction DR1 may be in the row direction and the second direction DR2 may be in the column direction.

Two or more of the plurality of sub-pixels SP may comprise a single pixel PXL. In FIG. 2, a pixel PXL is shown as comprising three sub-pixels SP1 to SP3, but embodiments are not limited thereto. For example, the pixel PXL may comprise two sub-pixels. Hereinafter, for ease of description, it is assumed that the pixel PXL comprises the first to third sub-pixels SP1 to SP3.

Each of the first to third sub-pixels SP1 to SP3 may generate light in one of various colors, such as red, green, blue, cyan, magenta, yellow, and the like. Hereinafter, for the sake of clarity and simplicity, it is assumed that the first sub-pixel SP1 is configured to generate light in the red color, the second sub-pixel SP2 is configured to generate light in the green color, and the third sub-pixel SP3 is configured to generate light in the blue color.

Each of the first to third sub-pixels SP1 to SP3 may comprise at least one light-emitting element configured to generate light. In embodiments, the light-emitting elements of the first to third sub-pixels SP1 to SP3 may generate light of the same color. For example, the light-emitting elements of the first to third sub-pixels SP1 to SP3 may generate blue-colored light. In other embodiments, the light-emitting elements of the first to third sub-pixels SP1 to SP3 may generate different colors of light. For example, the light-emitting elements of the first to third sub-pixels SP1 to SP3 may generate red-colored, green-colored, and blue-colored light, respectively.

As a display panel DP, a display panel capable of spontaneous light, such as a light-emitting diode display panel (LED display panel) that utilizes micro- or nanoscale light-emitting diodes as light-emitting elements, an organic light-emitting display panel (OLED panel) that utilizes organic light-emitting diodes as light-emitting elements, and the like, may be used.

In the non-display area NDA, components for controlling the sub-pixels SP may be located. Wiring associated with the sub-pixels SP, such as the scan lines SL, data lines DL, power lines PL, and ramp lines RL of FIG. 1, may be located in the non-display area NDA.

At least one of the driving controller 200, scan driver 300, data driver 400, and ramp driver 500 of FIG. 1 may be located in a non-display area NDA of the display panel DP. In embodiments, the scan driver 300 and the ramp driver 500 may be located in the non-display area NDA. In such cases, the driving controller 200 and the data driver 400 may be implemented as driver integrated circuits separate from the display panel DP, and the driver integrated circuits may be connected to wiring located in the non-display area NDA. In other embodiments, the scan driver 300 and the ramp driver 500 may be implemented as a single integrated circuit separate from the display panel DP, along with the driving controller 200 and the data driver 400.

In embodiments, the display area DA may have various shapes. The display area DA may have the shape of a closed loop that comprises straight and/or curved sides. For example, the display area DA may have the shape of a polygon, a circle, a semicircle, an ellipse, or the like.

In embodiments, the display panel DP may have a flat display surface. In other embodiments, the display panel DP may have a display surface that is at least partially rounded. In embodiments, the display panel DP may be bendable, foldable, or rollable. In such cases, the display panel DP and/or the substrate of the display panel DP may comprise materials having flexible properties.

Figure 3:
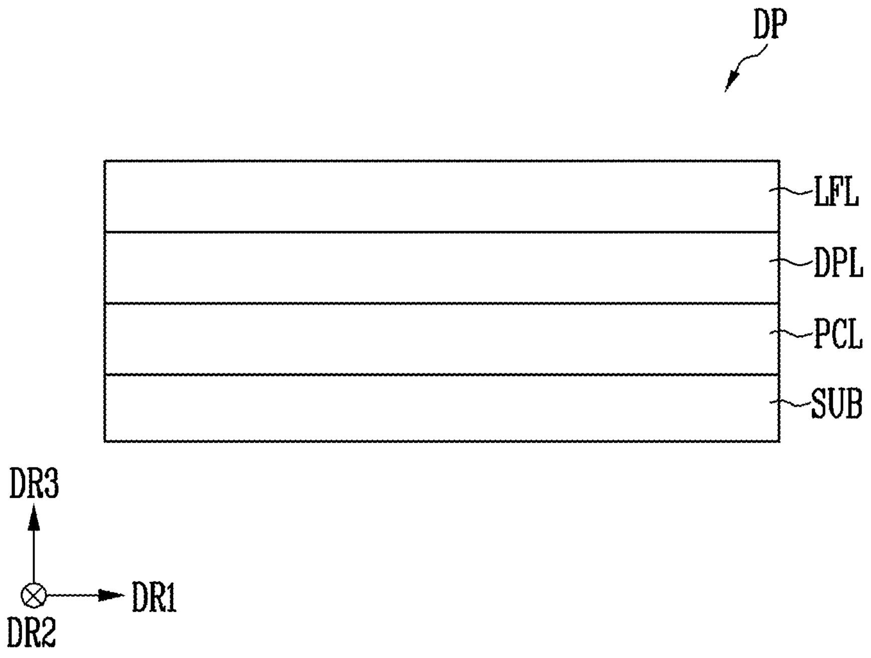
FIG. 3 is a cross-sectional view illustrating one or more embodiments of the display panel of FIG. 2.

FIG. 3 is a cross-sectional view illustrating one or more embodiments of the display panel of FIG. 2.

Referring to FIG. 3, the display panel DP may comprise a substrate SUB, and a pixel circuit layer PCL, a display element layer DPL, and a light functional layer LFL stacked sequentially in a third direction DR3 crossing the first and second directions DR1, DR2 on the substrate SUB.

The substrate may be made of an insulating material, such as glass or resin. For example, the substrate SUB may comprise a glass substrate. As another example, the substrate SUB may comprise a PI (polyimide) substrate. As another example, the substrate SUB may comprise a silicon wafer substrate formed using a semiconductor process.

In embodiments, the substrate SUB may be made of a flexible material that allows it to be bent or folded, and may have a monolayer structure or a multilayer structure. For example, flexible materials comprise polystyrene, polyvinyl alcohol, polymethyl methacrylate, polyethersulfone, polyacrylate, polyetherimide, polyethylene naphthalate, polyethylene terephthalate, polyethylene terephthalate, polyphenylene sulfide, polyarylate, polyimide, polycarbonate, triacetate cellulose, and/or cellulose acetate propionate. However, embodiments are not limited thereto.

A pixel circuit layer PCL is located on the substrate SUB. The pixel circuit layer PCL may comprise insulating layers, semiconductor patterns, and conductive patterns located between the insulating layers. The conductive patterns of the pixel circuit layer PCL may function as circuit elements, wiring, and the like.

The circuit elements of the pixel circuit layer PCL may comprise sub-pixel circuits of each of the sub-pixels SP of FIG. 2. In other words, the circuit elements of the pixel circuit layer PCL may be provided with transistors and one or more capacitors of the sub pixel circuit SPC.

The wiring of the pixel circuit layer PCL may comprise wiring connected to the sub-pixels SP. The wiring of the pixel circuit layer PCL may comprise various signal lines and/or voltage lines required to drive the display element layer DPL.

A display element layer DPL is located on the pixel circuit layer PCL. The display element layer DPL may comprise light-emitting elements of sub-pixels SP.

A light functional layer LFL may be located on the display element layer DPL. The light functional layer LFL may comprise light conversion patterns having color-conversion particles and/or scattering particles. For example, the color-conversion particles may comprise quantum dots. The quantum dots may change the wavelength (or color) of the light emitted from the display element layer DPL. The light functional layer LFL may further comprise light-scattering patterns having scattering particles. In embodiments, the light conversion patterns and light-scattering patterns may be omitted.

The light functional layer LFL may further comprise a color filter layer comprising color filters. The color filters may selectively transmit light of corresponding wavelengths (or, corresponding colors). In embodiments, the color filter layer may be omitted.

A window may be provided on the light functional layer LFL to protect an exposed surface (or upper surface) of the display panel DP. The window may protect the display panel DP from external impact. The window may be coupled to the light functional layer LFL by an optically transparent adhesive (or bonding) member. The window may have a multi-layer structure selected from a glass substrate, a plastic film, and a plastic substrate. The multilayer structure may be formed by a continuous process or by an adhesive process utilizing an adhesive layer. All or part of the window may be flexible.

Figure 4:
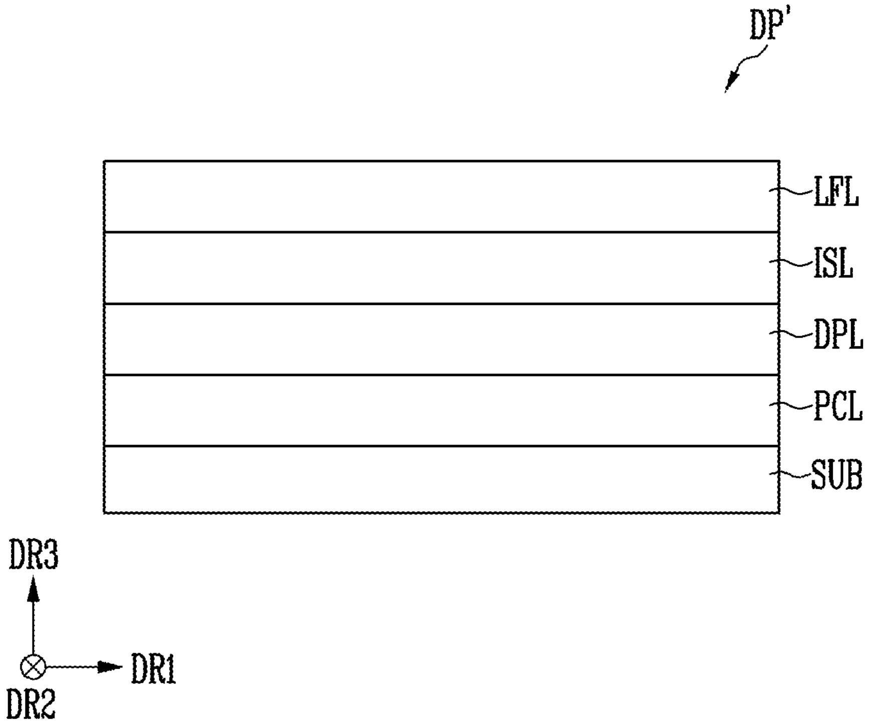
FIG. 4 is a cross-sectional view illustrating one or more other embodiments of the display panel of FIG. 2.

FIG. 4 is a cross-sectional view illustrating one or more other embodiments of the display panel of FIG. 2.

Referring to FIG. 4, the display panel DP' may comprise a substrate SUB, a pixel circuit layer PCL, a display element layer DPL, an input-sensing layer ISL, and a light functional layer LFL. The substrate SUB, the pixel circuit layer PCL, the display element layer DPL, and the light functional layer LFL may be configured the same as the substrate SUB, the pixel circuit layer PCL, the display element layer DPL, and the light functional layer LFL described with reference to FIG. 3. Hereinafter, redundant descriptions are omitted.

The input-sensing layer ISL may detect user input on the upper surface (or display surface) of the display panel DP'. The input-sensing layer ISL may comprise any configuration suitable for sensing external objects, such as a user's hand, pen, etc. For example, the input-sensing layer ISL may comprise touch electrodes.

Figure 5:
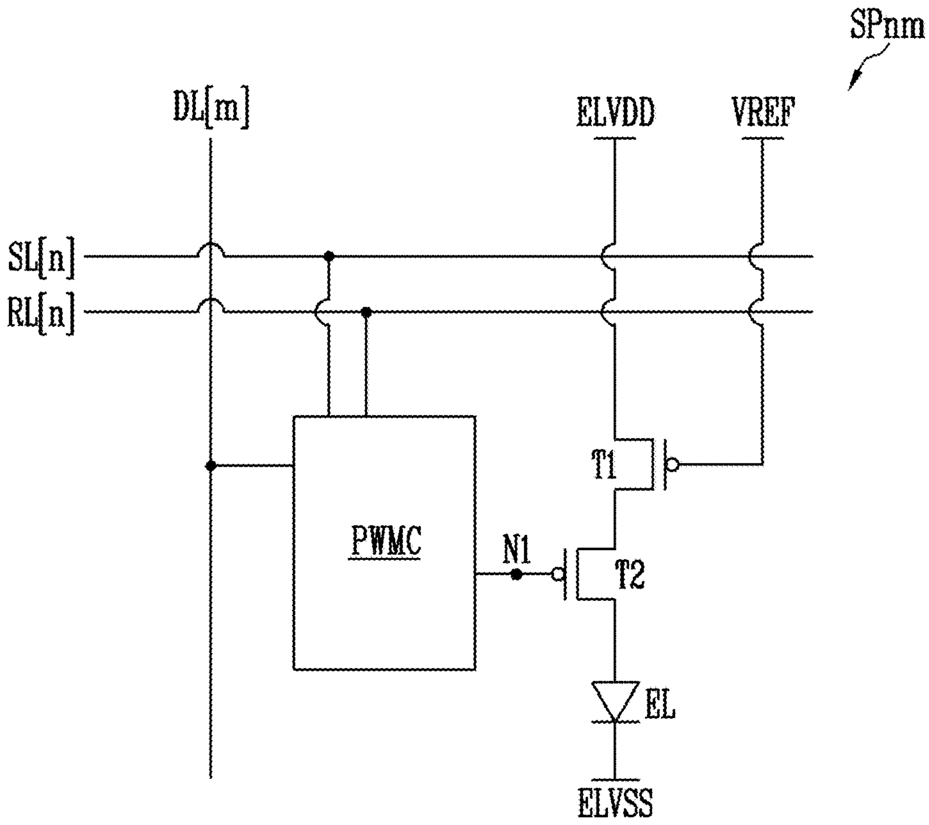
FIG. 5 is a schematic illustrating an example of the sub-pixel of FIG. 1.

FIG. 5 is a schematic illustrating an example of the sub-pixel of FIG. 1.

In FIG. 5, a sub-pixel SPnm of the sub-pixels SP of FIG. 1 arranged in n rows (n is a positive integer) and m columns (m is a positive integer) is shown.

Referring to FIG. 5, the sub-pixel SPnm may comprise a PWM generation circuit PWMC, a first transistor T1, a second transistor T2, and a light-emitting element EL.

The anode electrode of the light-emitting element EL may be connected to the first supply voltage ELVDD via the first transistor T1 and the second transistor T2, and the cathode electrode of the light-emitting element EL may be connected to the second supply voltage ELVSS.

The PWM generation circuit PWMC may be connected to the n-th scan line SL[n] of the scan lines SL of FIG. 1, the n-th ramp line RL[n] of the ramp lines RL of FIG. 1, and the mth data line DL[m] of the data lines DL of FIG. 1. The PWM 1 generation circuit PWMC may be connected to the control electrode of the second transistor T2. The PWM generation circuit PWMC may be driven in a PWM manner using a ramp signal provided to the n-th ramp line RL[n].

The first transistor T1 may comprise a control electrode receiving a reference voltage VREF, a first electrode receiving a first power voltage ELVDD, and a second electrode connected to the second transistor T2. The second transistor T2 may comprise a control electrode connected to the first node N1, a first electrode connected to the first transistor T1, and a second electrode connected to the light-emitting element EL. The light-emitting element EL may comprise a first electrode connected to the second transistor T2 and a second electrode receiving the second supply voltage ELVSS.

The transistors of the PWM generation circuit PWMC, the first transistor T1 and the second transistor T2, may be implemented as PMOS (p-channel metal oxide semiconductor) transistors.

However, the present disclosure is not limited thereto. For example, at least one of the transistors of the PWM generation circuit PWMC, the first transistor T1 and the second transistor T2 may be implemented as an NMOS (n-channel metal oxide semiconductor) transistor.

The transistors may be low temperature polycrystalline oxide (LTPO) thin film transistors where the active pattern (semiconductor layer) comprises an oxide. However, this is only an example and the transistors are not limited thereto. For example, the active pattern (semiconductor layer) comprised in the transistor may comprise an inorganic semiconductor (e.g., amorphous silicon, poly silicon) or an organic semiconductor. The transistors may also be low temperature poly-silicon (LTPS) thin film transistors where the active pattern (semiconductor layer) comprises amorphous silicon, poly silicon, or the like.

For an NMOS transistor, the low voltage level may be the disabling level and the high voltage level may be the enabling level. For a PMOS transistor, the low voltage level may be the enable level and the high voltage level may be the disable level.

In the write section, a data voltage may be written to the PWM generation circuit PWMC. The magnitude of the data voltage may vary depending on the gradient.

In the light-emitting section, the first transistor T1 may generate a constant magnitude of drive current. At this time, the initial voltage of the first node N1 may be set low enough, so that the second transistor T2 may be in a turn-on state. Thus, the light-emitting element EL may emit light. If the magnitude of the ramp signal decreases sufficiently over time, the PWM generation circuit PWMC may apply the first supply voltage ELVDD to the first node N1. The time at which the first power supply voltage ELVDD is applied to the first node N1 may correspond to the magnitude of the data voltage. At this time, the same voltage is applied to the control electrode of the second transistor T2 and the first electrode, so that the second transistor T2 is turned off, and the light-emitting element EL may stop emitting light.

The length of time the drive current is applied to the EL may vary depending on the light level. The longer the driving current is applied to the light-emitting element EL, the more the light-emitting element EL may display a high gradient.

Figure 6:
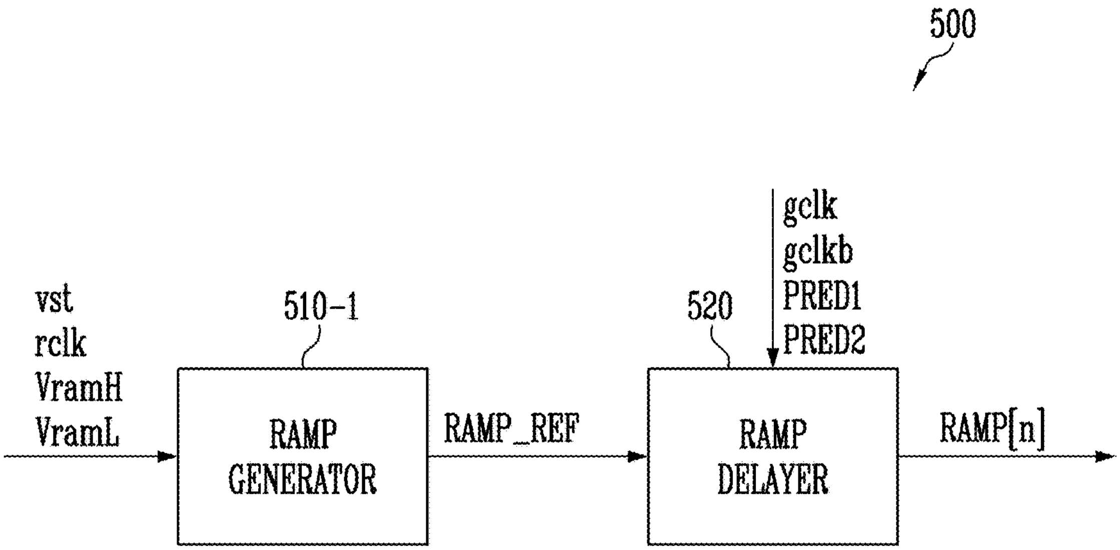
FIG. 6 is a diagram illustrating an example of the ramp driver of FIG. 1.

FIG. 6 is a diagram illustrating an example of the ramp driver of FIG. 1.

Referring to FIGS. 1 and 6, the ramp driver 500 may comprise a ramp generator 510-1 and a ramp delayer 520. The ramp generator 510-1 may generate a reference ramp signal RAMP_REF. The ramp delayer 520 may output a sequence of ramp signals ( . . . , RAMP[n], . . . ).

The ramp generator 510-1 may receive a vertical start signal vst, a ramp clock signal rclk, a high ramp voltage VramH, and a low ramp voltage VramL, and may generate a reference ramp signal RAMP_REF.

The vertical start signal vst and the ramp clock signal rclk may be comprised in the third control signal CONT3. For example, the vertical start signal vst may be a vertical synchronization signal.

In one or more embodiments, the high ramp voltage VramH and the low ramp voltage VramL may be provided to the ramp generator 510-1 from an external source of the display device. For example, the high ramp voltage VramH and the low ramp voltage VramL may be provided to the ramp generator 510-1 from a power management integrated circuit (PMIC).

In other embodiments, the high ramp voltage VramH and low ramp voltage VramL may be provided by the driving controller 200 or a power supply voltage generator inside the display device. For example, the driving controller 200 or power supply voltage generator may receive a reference power supply voltage from an external source to generate the high ramp voltage VramH and low ramp voltage VramL.

The ramp delayer 520 may receive a reference ramp signal RAMP_REF, a gate clock signal (e.g., a reference gate clock signal, in the claims) gclk, an invert gate clock signal gclkb, a first predicted voltage PRED1, and a second predicted voltage PRED2, and generate ramp signals ( . . . , RAMP[n], . . . ).

The gate clock signal gclk and the invert gate clock signal gclkb may be comprised in the third control signal CONT3. For example, the invert gate clock signal gclkb may be a signal that inverts the gate clock signal gclk (e.g., a signal that is an inverted form of the gate clock signal gclk).

In one or more embodiments, the gate clock signal gclk may be the same as the gate clock signal comprised in the first control signal CONT1. According to one or more embodiments, by controlling the scan driver 300 and the ramp driver 500 with the same clock signal, a cost may be reduced.

In other embodiments, the ramp delayer 520 may generate the invert gate clock signal GCLKB itself by inverting the gate clock signal GCLK, rather than receiving the invert gate clock signal GCLKB from an external source. In this case, additional cost savings may be realized.

In one or more embodiments, the first predicted voltage PRED1 and the second predicted voltage PRED2 may be provided to the ramp generator 510-1 from outside of the display device. For example, the first predicted voltage PRED1 and the second predicted voltage PRED2 may be provided to the ramp delayer 520 from a power management integrated circuit.

In other embodiments, the first predicted voltage PRED1 and the second predicted voltage PRED2 may be provided by the driving controller 200 or a power supply voltage generator inside the display device. For example, the driving controller 200 or the power supply voltage generator may receive a reference power supply voltage from an external source to generate the first predicted voltage PRED1 and the second predicted voltage PRED2.

Figure 7:
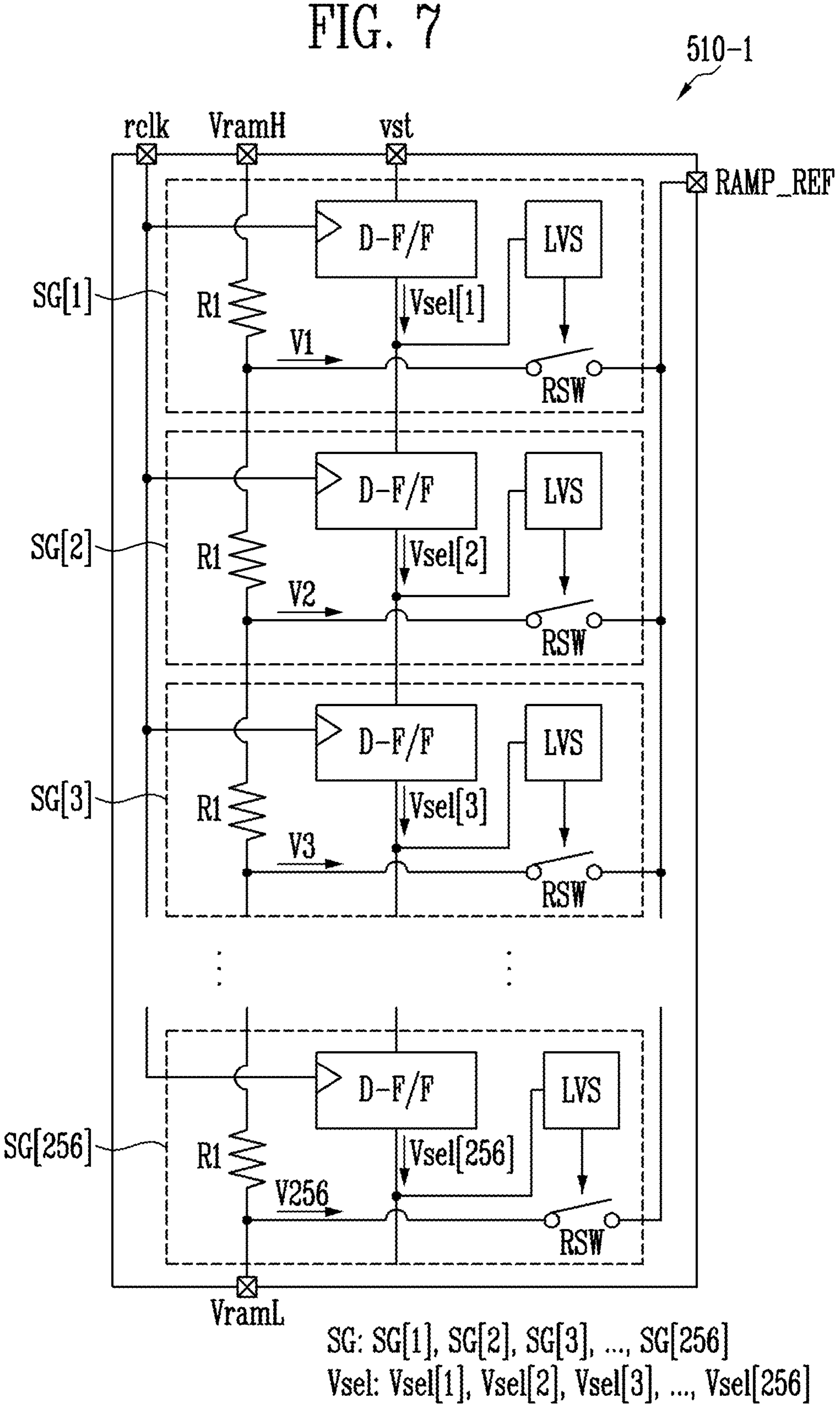
FIG. 7 is a diagram illustrating an example of the ramp generator of FIG. 6.

FIG. 7 is a diagram illustrating an example of the ramp generator of FIG. 6.

Referring to FIG. 7, the ramp generator 510-1 may comprise a resistor string and a stage SG. The resistor string may comprise a first resistor element R1, and may be located between a first terminal where a high ramp voltage VramH is applied and a second terminal where a low ramp voltage VramL is applied. The resistor string may generate the first to p-th voltages by dividing the high ramp voltage VramH. In this case, the first to p-th voltages may fall in a range between the low ramp voltage VramL and the high ramp voltage VramH. The ramp generator 510-1 may generate a reference ramp signal RAMP_REF by sequentially outputting the first to p-th voltages. For example, the ramp generator 510-1 may comprise stages SG, and each of the stages SG may output at least one of the first to p-th voltages. Here, p is a positive integer, and in FIG. 7, it is assumed that p is 256. Each of the stages SG may be connected to a corresponding first resistor element R1.

Each of the stages SG may comprise flip-flops D-F/F, a level shifter LVS, and a ramp switch RSW. The flip-flops D-F/F may sequentially output ramp control signals Vsel in response to a ramp clock signal rclk and a vertical start signal vst (or a ramp control signal from a previous flip-flop). The ramp switch RSW may comprise a first terminal connected to the first resistor element R1 and a second terminal connected to the output of the ramp generator 510-1. The level shifter LVS may turn on the corresponding ramp switch RSW upon receiving a corresponding ramp control signal.

For example, the flip-flops D-F/F of the first stage SG[1] may receive a vertical start signal vst, and the flip-flops D-F/F of the second stage SG[2] may receive a first ramp control signal Vsel[1] output from the flip-flops D-F/F of the first stage SG[1]. The third to 256-th stages SG[3] to SG[256] may receive the ramp control signal Vsel of a respective previous stage, similar to the second stage SG[2].

The level shifters LVS may change the ramp control signals Vsel, which are digital voltage signals, into analog voltage signals. Because the ramp control signals Vsel are digital voltage signals, it is difficult to directly control the ramp switch RSW, which is an analog voltage switch. Therefore, the level shifters LVS may be provided to adjust the voltage level of the ramp control signals Vsel.

Figure 8:
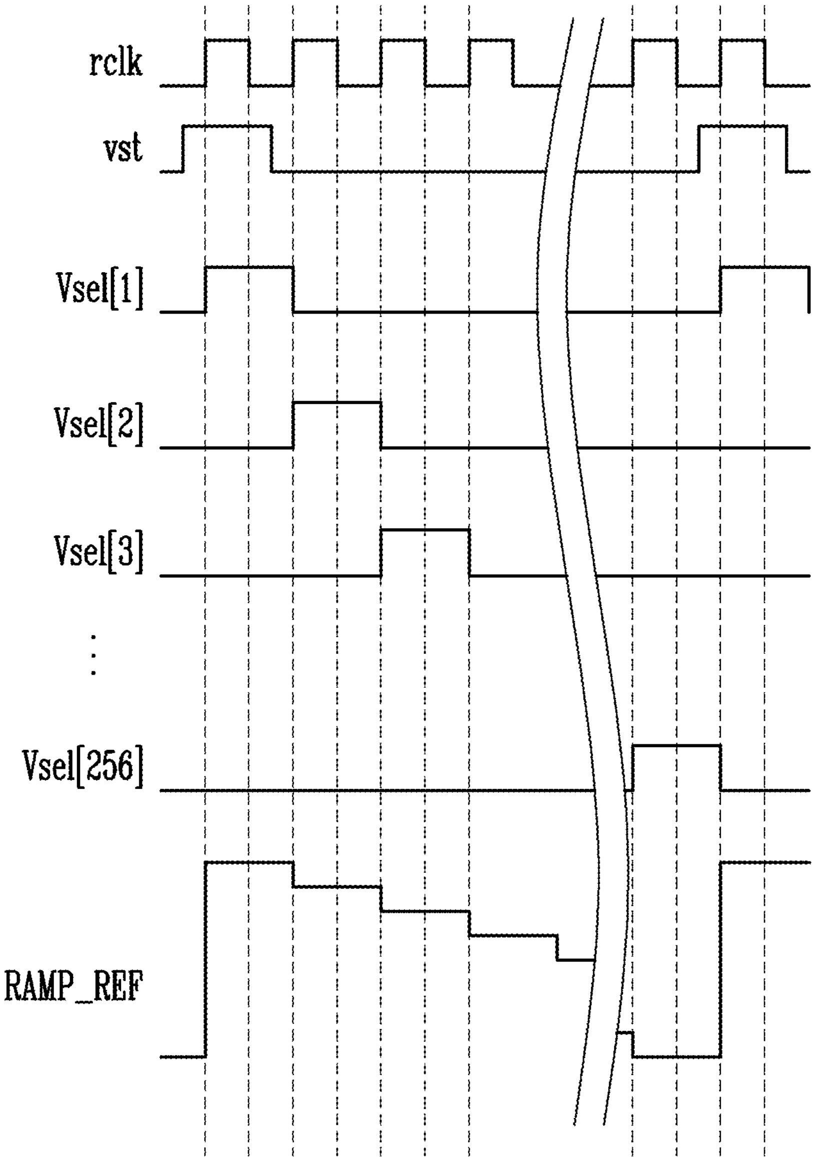
FIG. 8 is a timing diagram illustrating an example of in which the ramp generator of FIG. 7 is driven.

FIG. 8 is a timing diagram illustrating an example in which the ramp generator of FIG. 7 is driven.

Referring to FIGS. 1, 7, and 8, the driving controller 200 may drive the display panel 100 at a drive frequency. The ramp generator 510-1 may comprise stages SG that sequentially output first to p-th voltages (e.g., first to 256-th voltages V1 to V256) at each period of the ramp clock signal rclk. The frequency of the ramp clock signal rclk may be a product of the drive frequency and the number of first resistor elements R1 of the resistor string.

The vertical start signal vst may have an enable level at the beginning of a frame. The flip-flops D-F/F of the first stage SG[1] may output a first ramp control signal Vsel[1] in response to the vertical start signal vst and the ramp clock signal rclk. The level shifter LVS of the first stage SG[1] may turn on the ramp switch RSW of the first stage SG[1] in response to the first ramp control signal Vsel[1]. Thus, the first voltage V1 may be output to the output terminal of the ramp generator 510-1.

The flip-flops D-F/F of the second stage SG[2] may output the second ramp control signal Vsel[2] in response to the first ramp control signal Vsel[1] and the ramp clock signal rclk. The level shifter LVS of the second stage SG[2] may turn on the ramp switch RSW of the second stage SG[2] in response to the second ramp control signal Vsel[2]. Thus, the second voltage V2 may be output to the output terminal of the ramp generator 510-1.

Hereinafter, the third to 256-th stages SG[3] to SG[256] operate substantially the same as the second stage SG[2], so redundant description is omitted.

The first to 256-th voltages V1 to V256 may be larger as they become closer to the high ramp voltage VramH, and may be smaller as they become closer to the low ramp voltage VramL. The reference ramp signal RAMP_REF may be a combination of the first to 256-th voltages V1 to V256. Accordingly, the reference ramp signal RAMP_REF may gradually decrease in a stepwise manner. However, for convenience of explanation, the reference ramp signal RAMP_REF is simply represented as linear in FIGS. 14 and 16.

Figure 9:
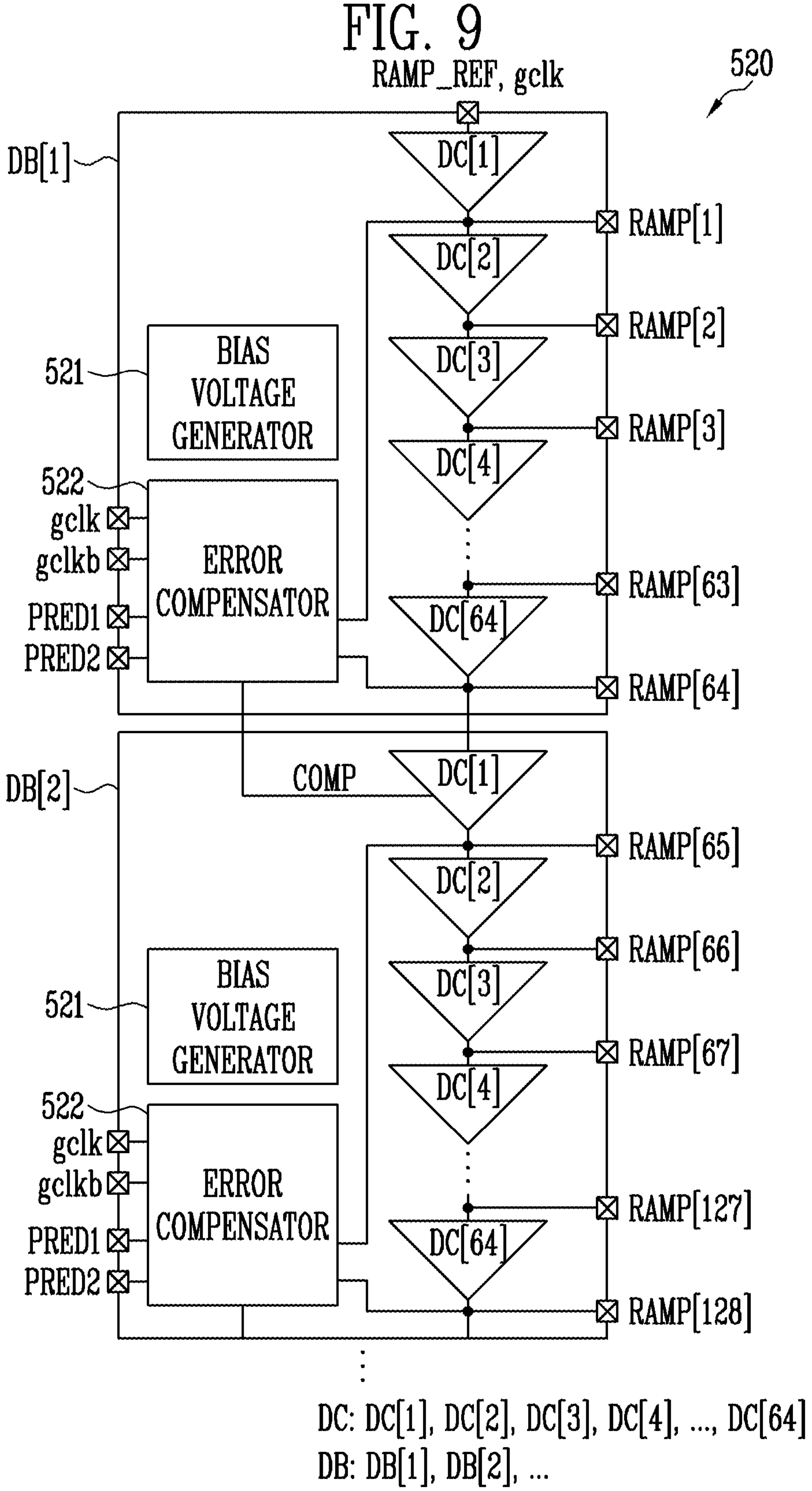
FIG. 9 is a diagram illustrating an example of the ramp delayer of FIG. 6.

FIG. 9 is a diagram illustrating an example of the ramp delayer of FIG. 6.

Referring to FIG. 9, the ramp delayer 520 may comprise j delay blocks DB, where j is an integer that is greater than or equal to two. Each of the delay blocks DB may comprise k output terminals, where k is an integer that is greater than or equal to 2. Each of the delay blocks DB may comprise k delay circuits DC connected to a corresponding output of the k outputs. The delay circuits DC may be connected sequentially to each other. Each of the delay circuits DC may delay the input ramp signal to output an output ramp signal. The first delay circuit (e.g., initial delay circuit) DC[1] of the first delay block DB[1] may receive a reference ramp signal RAMP_REF and a gate clock signal (e.g., a reference gate clock signal) gclk, and the first delay circuit DC[1] of the second delay block DB[2] may receive the output signal of the last delay circuit of the first delay block DB[1] (e.g., the 64-th delay circuit DC[64]). In FIG. 9, it is assumed that k is 64.

The output signal of each of the delay circuits DC may be provided to a corresponding a pixel row as a ramp signal. For example, the first to 64-th delay circuits DC[1] to DC[64] of the first delay block DB[1] may sequentially output the first to 64-th ramp signals RAMP[1] to RAMP[64], and the first to 64-th delay circuits DC[1] to DC[64] of the second delay block DB[2] may sequentially output the 65-th to 128-th ramp signals RAMP[65] to RAMP[128].

The delay blocks after the second delay block DB[2] operates substantially the same as the second delay block DB[2], so redundant descriptions are omitted.

Each of the delay blocks DB may comprise a bias voltage generator 521. The bias voltage generator 521 may provide bias voltages to the first amplifier AMP1 (see FIGS. 10A and 15) and the second amplifier AMP2, (see FIG. 13) described later. The first amplifier and the second amplifier may be driven by receiving the bias voltages.

Each of the delay blocks DB may comprise an error compensator 522. This will be described in more detail later.

Figure 10A:
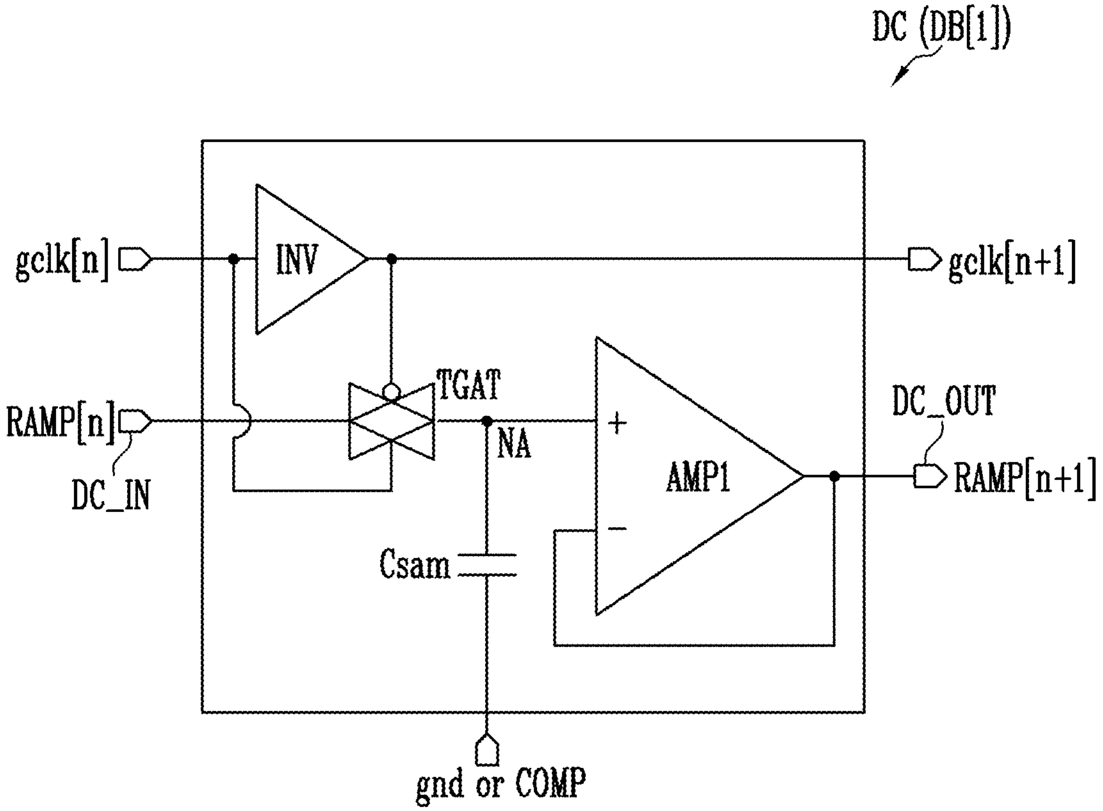
FIG. 10A is a schematic illustrating an example of a delay circuit of the first delay block of FIG. 9.
Figure 10B:
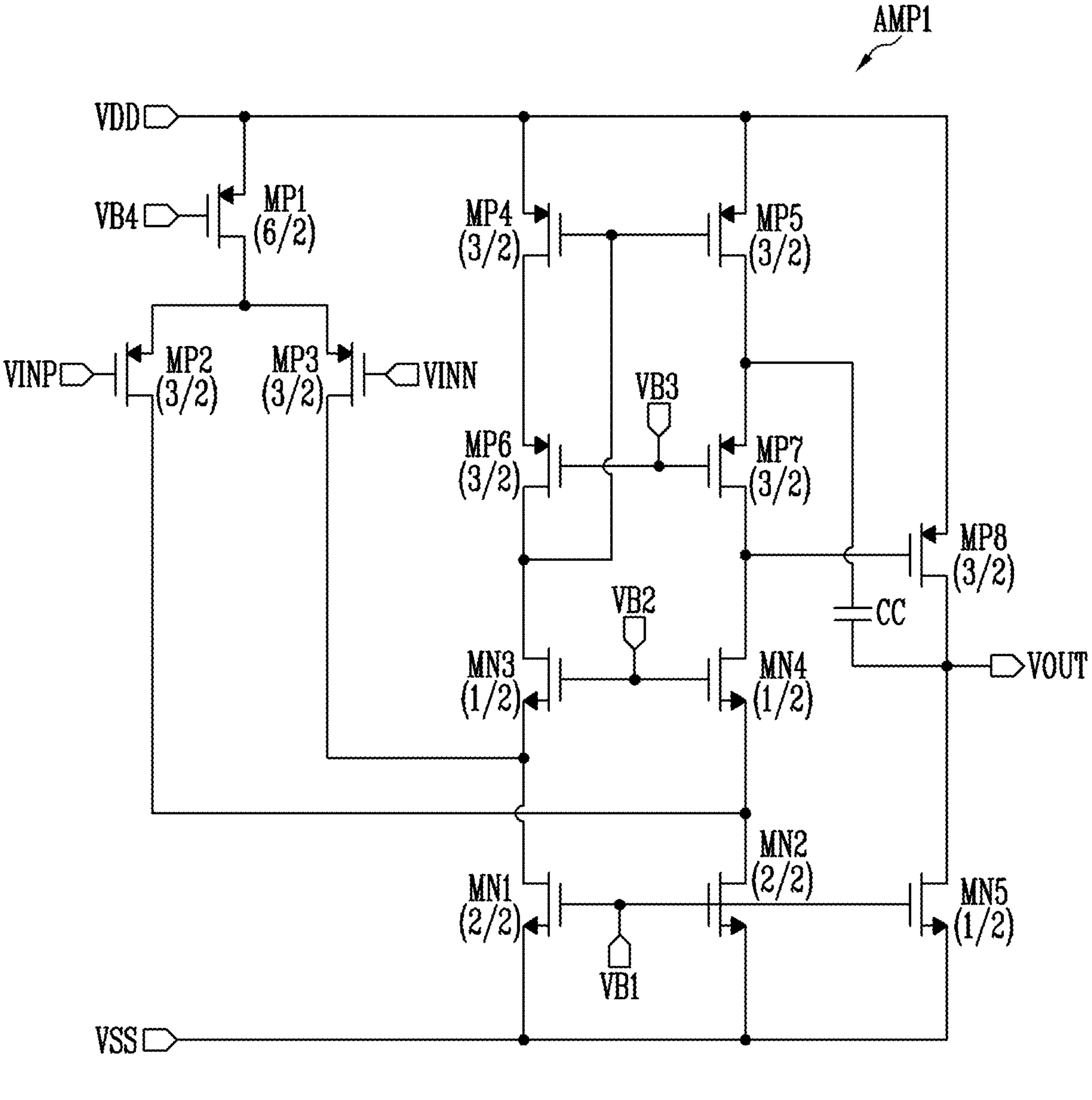
FIG. 10B is a schematic illustrating an example of the first amplifier of FIG. 10A.
Figure 11:
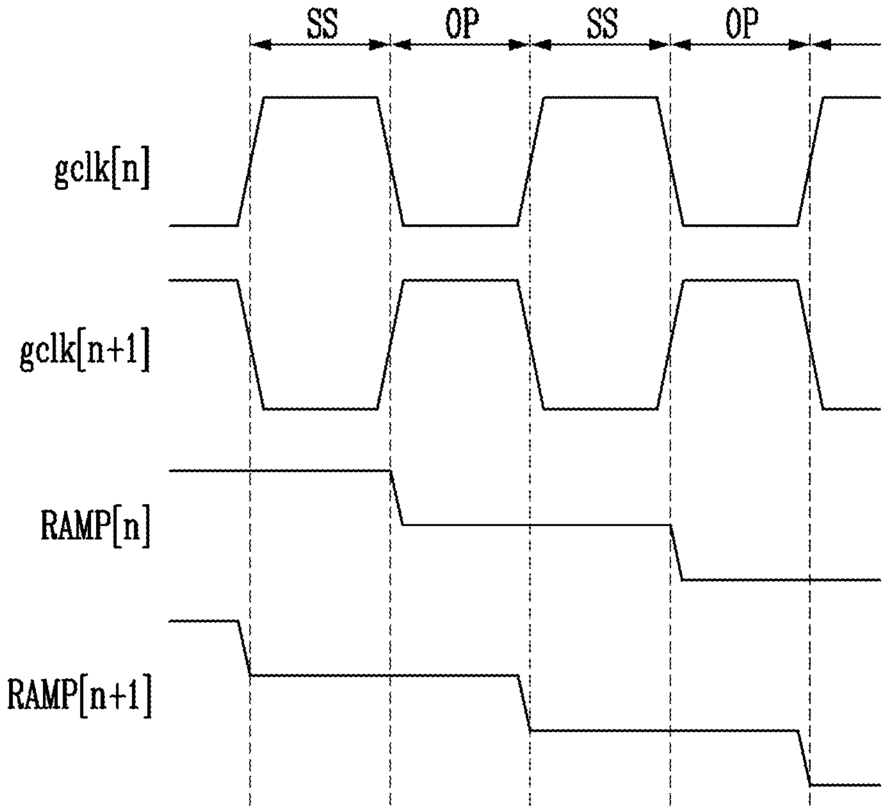
FIG. 11 is a timing diagram illustrating an example in which the delay circuit of FIG. 10A is driven.

FIG. 10A is a schematic illustrating an example of the delay circuit of the first delay block of FIG. 9. FIG. 10B is a schematic illustrating an example of the first amplifier of FIG. 10A. FIG. 11 is a timing diagram illustrating an example in which the delay circuit of FIG. 10A is driven.

Each of the delay circuits DC may receive an output ramp signal of the previous delay circuit as an input ramp signal RAMP[n], and an output gate clock signal of the previous delay circuit as an input gate clock signal gclk[n]. Further, each of the delay circuits DC may delay the input ramp signal RAMP[n] to output an output ramp signal RAMP[n+1]. Each of the delay circuits DC may invert the input gate clock signal gclk[n] to output the output gate clock signal gclk[n+1].

However, the initial delay circuit (e.g., the first delay circuit DC[1] of the first/initial delay block DB[1]) may delay the reference ramp signal RAMP_REF to generate the output ramp signal RAMP[1] and invert the gate clock signal gclk to generate the output gate clock signal.

Referring to FIGS. 9 and 10A, the delay circuit DC may comprise a first amplifier AMP1, an inverter INV, a transmission gate TGAT, and a sampling capacitor Csam.

The first amplifier AMP1 may comprise a first input terminal (e.g., a non-inverting input terminal), a second input terminal (e.g., an inverting input terminal), and an output terminal connected to the second input terminal.

The first electrode of the sampling capacitor Csam may be connected to the first input terminal of the first amplifier AMP1 (e.g., A node NA). The second electrode of the sampling capacitor Csam may receive a ground voltage gnd or a compensation control signal COMP. For example, the second electrode of the sampling capacitor Csam of the first delay circuit DC[1] of the remaining delay blocks (DB[2], . . . ) except the first delay block DB[1] may receive the compensation control signal COMP. The second electrode of the sampling capacitor Csam of the remaining delay circuits DC may receive a ground voltage gnd.

A transmission gate TGAT may be connected between the input terminal DC_IN and the A node NA. The transmission gate TGAT may be turned on upon receiving an input gate clock signal gclk[n] at an enable voltage level or an output gate clock signal gclk[n+1] at a disable voltage level. For example, the transmission gate TGAT may be a circuit with an NMOS transistor and a PMOS transistor in parallel. The NMOS transistor may be turned on when the control electrode receives an input gate clock signal gclk[n] at an enable voltage level (high voltage level). The PMOS transistor may be turned on when the control electrode receives an output gate clock signal gclk[n+1] of a deactivation voltage level (low voltage level).

The input terminal of the inverter INV may receive an input gate clock signal gclk[n]. The output terminal of the inverter INV may output an output gate clock signal gclk [n+1] that inverts the input gate clock signal gclk[n]. The first delay circuit DC[1] of the first delay block DB[1] may receive the gate clock signal gclk as an input gate clock signal.

According to one or more embodiments, the delay circuits DC may not use a common gate clock signal gclk and an invert gate clock signal gclkb. Thus, the likelihood of the transmission gates TGAT of the delay circuits DC being momentarily shorted by the RC delay may be reduced or prevented.

For example, the frequency of the gate clock signal gclk may be the product of the drive frequency of each frame FR and the number of rows of pixels.

Referring to FIG. 10B, the first amplifier AMP1 may comprise transistors MP1 to MP8, MN1 to MN5, and a capacitor CC. For example, the transistors MP1 to MP8 may be PMOS transistors. Transistors MN1 to MN5 may be NMOS transistors. The numbers in parentheses written below the figures symbols of each transistor MP1~MP8, MN1~MN5 may represent the channel width-to-length ratios.

The first amplifier AMP1 may decrease the voltage VOUT of the output terminal of the first amplifier AMP1 based on the first bias voltage VB1, and may increase the voltage VOUT of the output terminal of the first amplifier AMP1 based on the voltages at the first input terminal and the second input terminal of the first amplifier AMP1.

The first amplifier AMP1 may generate an output voltage VOUT based on a non-inverting input voltage VINP and an inverting input voltage VINN. The output voltage VOUT may be determined in a range between the first drive voltage VDD and the second drive voltage VSS. The first amplifier AMP1 may be tuned based on the first to fourth bias voltages VB1, VB2, VB3, and/or VB4. The first to fourth bias voltages VB1, VB2, VB3, and/or VB4 may be received from the bias voltage generator 521 (see FIG. 9).

The first electrode of the transistor MP1 may receive a first drive voltage VDD, the second electrode may be connected to the first electrodes of the transistors MP2, MP3, and the control electrode may receive a fourth bias voltage VB4.

The first electrode of the transistor MP2 may be connected to the second electrode of the transistor MP1, the second electrode may be connected to the second electrode of the transistor MN4, and the control electrode may be connected to a first input terminal (e.g., a non-inverting input terminal) of the first amplifier AMP1. The control electrode of the transistor MP2 may receive a non-inverting input voltage VINP.

The first electrode of the transistor MP3 may be connected to the second electrode of the transistor MP1, the second electrode may be connected to the second electrode of the transistor MN3, and the control electrode may be connected to a second input terminal (e.g., an inverting input terminal) of the first amplifier AMP1. The control electrode of the transistor MP3 may receive the inverting input voltage VINN.

The first electrode of the transistor MP4 may receive the first drive voltage VDD, the second electrode may be connected to the first electrode of the transistor MP6, and the control electrode may be connected to the first electrode of the transistor MN3.

The first electrode of transistor MP5 may receive a first drive voltage VDD, the second electrode may be connected to the first electrode of transistor MP7, and the control electrode may be connected to the control electrode of transistor MP4.

The first electrode of the transistor MP6 is connected to the second electrode of the transistor MP4, the second electrode is connected to the first electrode of the transistor MN3, and the control electrode may receive a third bias voltage VB3.

The first electrode of the transistor MP7 is connected to the second electrode of the transistor MP5, the second electrode is connected to the first electrode of the transistor MN4, and the control electrode may receive the third bias voltage VB3.

The first electrode of the transistor MP8 may receive the first drive voltage VDD, the second electrode may be connected to the output terminal of the first amplifier AMP1, and the control electrode may be connected to the first electrode of the transistor MN4. The transistor MP8 may provide an output voltage VOUT through its output terminal.

The capacitor CC may have a first electrode connected to the second electrode of the transistor MP5, and the second electrode may be connected to the output of the first amplifier AMP1.

The first electrode of the transistor MN1 may be connected to the second electrode of the transistor MP3, the second electrode may receive a second drive voltage VSS, and the control electrode may receive a first bias voltage VB1.

The first electrode of the transistor MN2 is connected to the second electrode of the transistor MP2, the second electrode may receive the second drive voltage VSS, and the control electrode may receive the first bias voltage VB1.

The first electrode of the transistor MN3 is connected to the control electrode of the transistor MP4, the second electrode is connected to the second electrode of the transistor MP3, and the control electrode may receive the second bias voltage VB2.

The first electrode of the transistor MN4 is connected with the control electrode of the transistor MP8, the second electrode is connected with the second electrode of the transistor MP2, and the control electrode may receive the second bias voltage VB2.

The first electrode of the transistor MN5 may be connected to the output of the first amplifier AMP1, the second electrode may receive the second drive voltage VSS, and the control electrode may receive the first bias voltage VB1.

The first amplifier AMP1 of one or more embodiments may be well suited to generate a ramp signal, where the voltage level initially rises rapidly, and the voltage level slowly decreases over time. For example, transistor MN5 may continuously sink a small current based on the first bias voltage VB1. Transistor MP5, on the other hand, may instantaneously drive a strong current to its output, which is advantageous for substantially instantaneously raising a high voltage.

Meanwhile, the first amplifier AMP1 may be adapted to the dynamic load capacitance of the pixel rows. For example, in the process of writing the data voltage, the capacitors comprised in the PWM generation circuits PWMC of each pixel row may be capacitively coupled to the corresponding ramp lines, resulting in a large load. On the other hand, in the light emission period, the capacitors comprised in the PWM generation circuits PWMC of each pixel row may be capacitively uncoupled from the corresponding ramp lines, resulting in a small load. The first amplifier AMP1 is robust to such dynamic load capacitance.

Referring to FIGS. 10A and 11, the input gate clock signal gclk[n] may have an enable voltage level in the sampling interval SS, and a disable voltage level in the output interval OP. The output gate clock signal gclk[n+1] may have a disable voltage level in the sampling interval SS, and an enable voltage level in the output interval OP. For example, the first amplifier AMP1 may be a single-gain amplifier.

In the sampling section SS, the transmission gate TGAT may be turned on by the input gate clock signal gclk[n] at the enable voltage level and the output gate clock signal gclk [n+1] at the disable voltage level. Therefore, the n-th ramp signal RAMP[n], which is the voltage at the input terminal DC_IN of the delay circuit DC, may be applied to the A node NA, and because the inverting input terminal of the first amplifier AMP1 is in a virtual short circuit with the non-inverting input terminal (A node NA), the n-th+1 ramp signal RAMP[n+1], which is the voltage at the output terminal DC_OUT of the delay circuit DC, may be substantially equal to the n-th ramp signal RAMP[n].

In the output section OP, the transmission gate TGAT may be turned off by the input gate clock signal gclk[n] at the disable voltage level and the output gate clock signal gclk [n+1] at the enable voltage level. At this time, even if the voltage of the n-th ramp signal RAMP[n] of the input terminal DC_IN falls, the voltage of the A node NA may be maintained by the sampling capacitor Csam. Therefore, the n+1 ramp signal RAMP[n+1] may be kept unchanged.

The n-th ramp signal RAMP[n] may be delayed for a certain time through the delay circuit DC and output as the n-th+1 ramp signal RAMP[n+1]).

Figure 12:
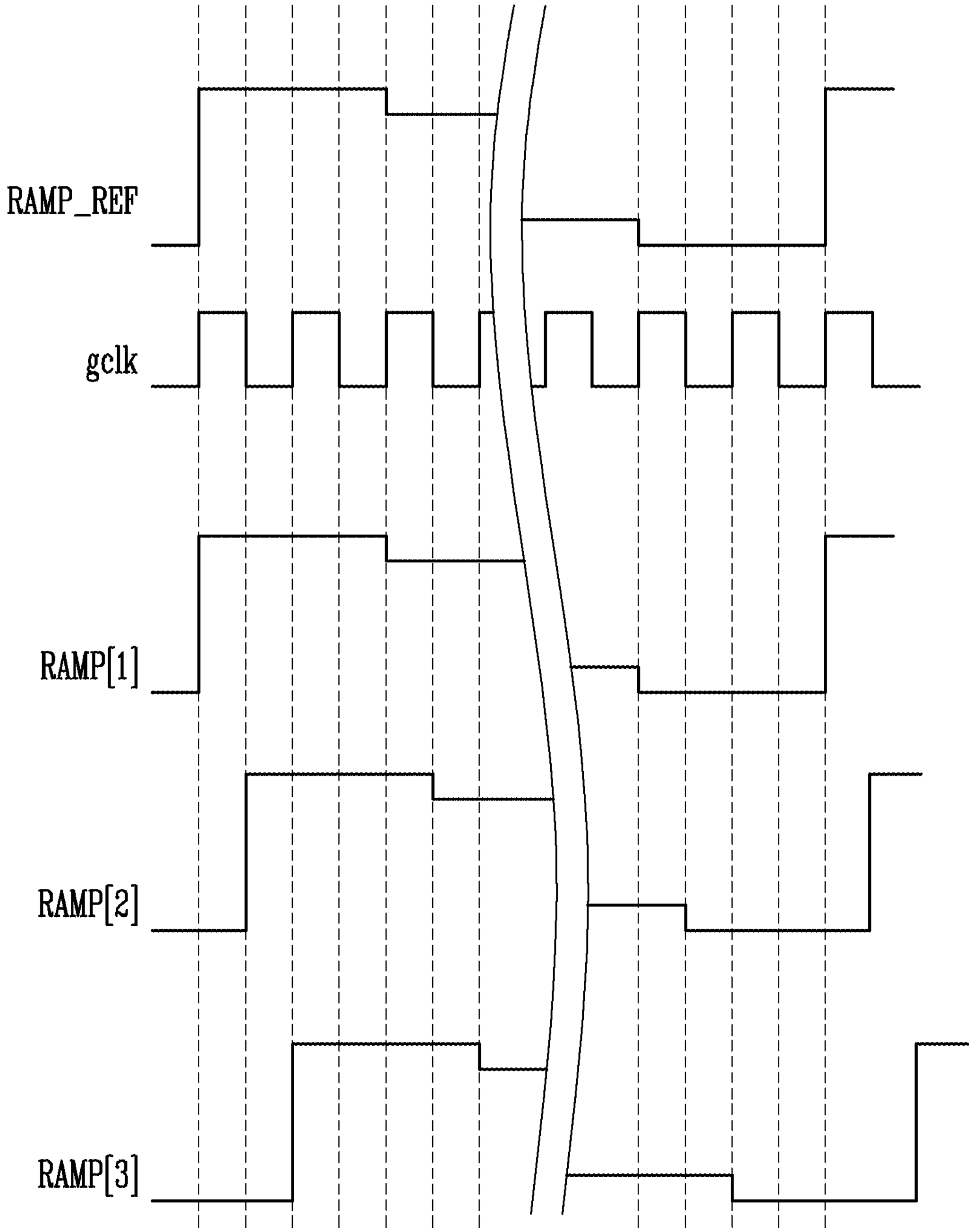
FIG. 12 is a timing diagram illustrating an example in which the delay circuits 1 of FIG. 9 are driven.

FIG. 12 is a timing diagram illustrating an example in which the delay circuits of FIG. 9 are driven.

Referring to FIGS. 9 and 12, the delay circuit DC may output ramp signals (RAMP[1], RAMP[2], RAMP[3], . . . ) sequentially in response to the reference ramp signal RAMP_REF and the gate clock signal gclk.

For example, the second delay circuit DC[2] of the first delay block DB[1] may delay the first ramp signal RAMP [1], and may output the first ramp signal RAMP[1] as the second ramp signal RAMP[2], and the third delay circuit DC[3] of the first delay block DB[1] may delay the second ramp signal RAMP[2], and may output the second ramp signal RAMP[2] as the third ramp signal RAMP[3].

Figure 13:
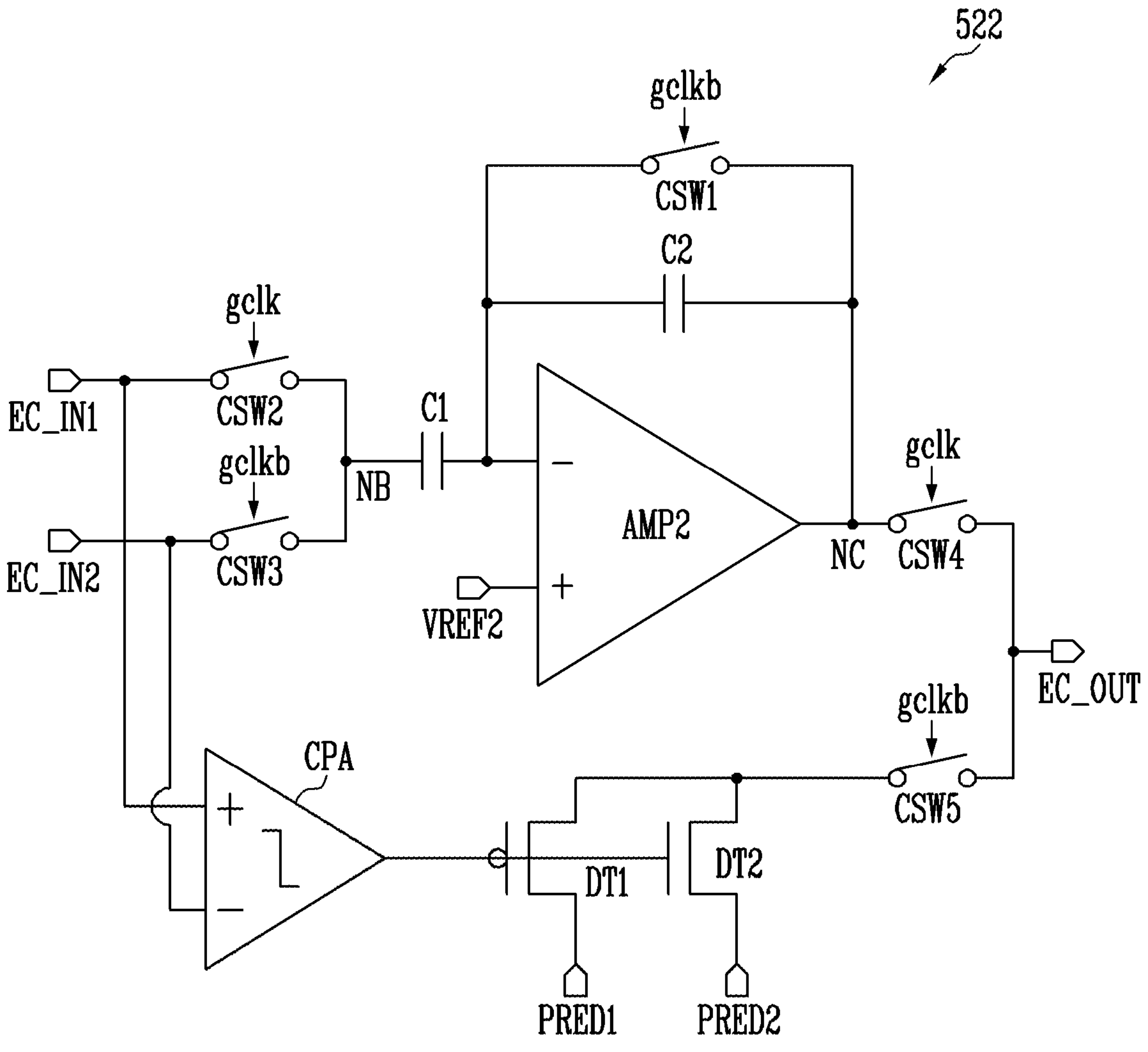
FIG. 13 is a timing diagram illustrating an example of the error compensator of FIG. 9.

FIG. 13 is a timing diagram illustrating an example of the error compensator of FIG. 9.

Referring to FIGS. 9 and 13, the error compensator 522 may generate a compensation control signal COMP by comparing the output signal of the first delay circuit DC[1] with the output signal of the 64-th delay circuit DC[64] (e.g., the last delay circuit).

The error compensator 522 may comprise a second amplifier AMP2, switches CSW1 to CSW5, capacitors C1 and C2, transistors DT1 and DT2, and a comparator CPA.

The second amplifier AMP2 may comprise a first input terminal (e.g., an inverting input terminal), a second input terminal (e.g., a non-inverting input terminal) receiving the reference voltage VREF2, and an output terminal.

The first capacitor C1 may comprise a first electrode connected to the B node NB, and a second electrode connected to the first input of the second amplifier AMP2.

The second capacitor C2 may comprise a first electrode connected to a first input terminal of the second amplifier AMP2, and a second electrode connected to an output terminal of the second amplifier AMP2 (e.g., C node NC).

The switch CSW1 may turn on in response to an invert gate clock signal gclkb, and may comprise a first terminal connected to a first input terminal of the second amplifier AMP2, and a second terminal connected to an output terminal of the second amplifier AMP2.

The switch CSW2 may turn on in response to a gate clock signal gclk, and may comprise a first terminal connected to a first input terminal EC_IN1 of the error compensator 522, and a second terminal connected to a first electrode of the first capacitor C1.

The switch CSW3 may turn on in response to the invert gate clock signal gclkb, and may comprise a first terminal connected to the second input terminal EC_IN2 of the error compensator 522, and a second terminal connected to the first electrode of the first capacitor C1.

The switch CSW4 may be turned on in response to a gate clock signal gclk, and may comprise a first terminal connected to an output terminal of the second amplifier AMP2, and a second terminal connected to an output terminal EC_OUT of the error compensator 522.

The comparator CPA may output a comparison signal by comparing a signal at the first input of the error compensator 522 (e.g., the first ramp signal RAMP[1]) with a signal at the second input of the error compensator 522 (e.g., the 64-th ramp signal RAMP[64]).

The transistor DT1 may comprise a control electrode that receives the comparison signal, a first electrode that receives the first predicted voltage PRED1, and a second electrode.

Transistor DT2 may comprise a control electrode that receives the comparison signal, a first electrode that receives a second predicted voltage PRED2 that is different from the first predicted voltage PRED1, and a second electrode. Transistor DT1 may be a different type than transistor DT2. For example, transistor DT1 may be implemented as a PMOS transistor and transistor DT2 may be implemented as an NMOS transistor.

The switch CSW5 may turn on in response to the invert gate clock signal gclkb, and may comprise a first terminal connected to the second electrodes of the transistors DT1, DT2, and a second terminal connected to the output terminal EC_OUT of the error compensator 522.

The error compensator 522 may utilize the gate clock signal gclk received by the first delay circuit DC[1] of the first delay block DB[1]. Thus, it is not necessary to utilize another clock signal, which may result in cost savings.

Meanwhile, the error compensator 522 may utilize the output gate clock signal output by the odd-numbered delay circuit DC instead of the invert gate clock signal gclkb. In such a case, additional cost savings may be realized.

Figure 14:
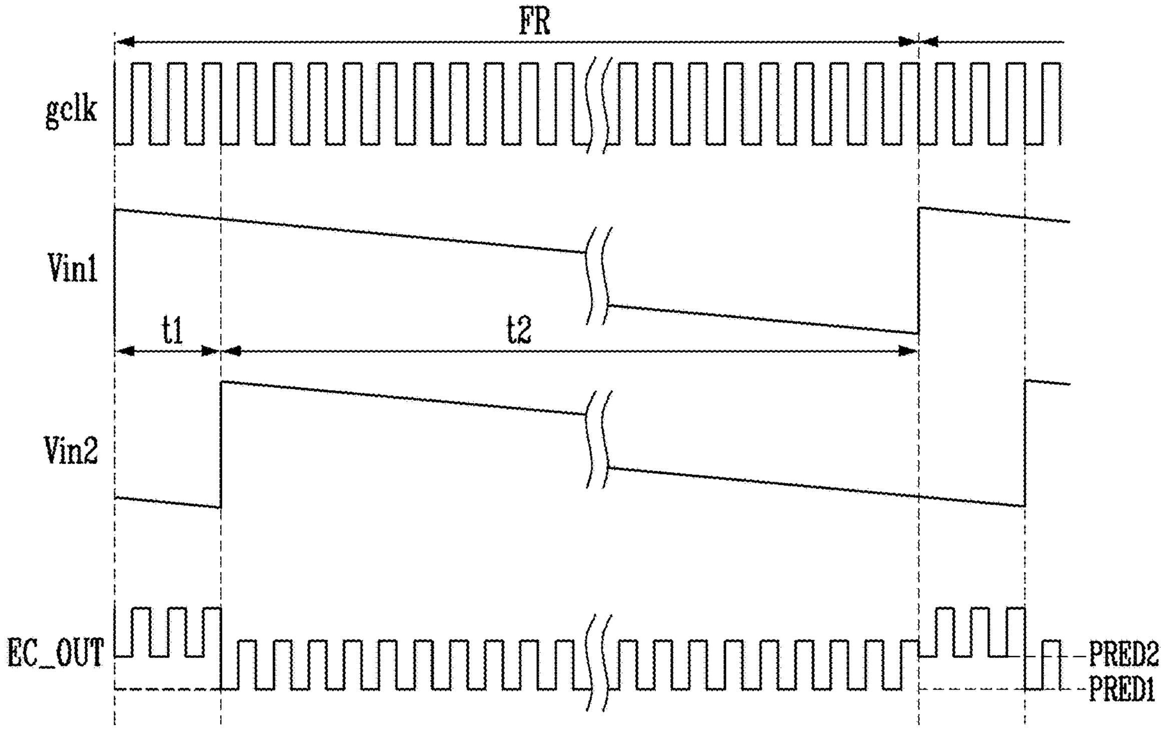
FIG. 14 is a timing diagram illustrating an example in which the error compensator of FIG. 13 is driven.

FIG. 14 is a timing diagram illustrating an example in which the error compensator of FIG. 13 is driven.

When the invert gate clock signal gclkb has an enable voltage level, the voltage Vin2 of the second input terminal EC_IN2 of the error compensator 522 is applied to the first electrode of the first capacitor C1, the second capacitor C2 is initialized, and the voltage of the C node NC may be the reference voltage VREF.

When the gate clock signal gclk has the enable voltage level, the voltage Vin1 of the first input terminal EC_IN1 of the error compensator 522 is applied to the first electrode of the first capacitor C1, and the voltage of the C node NC may reflect the amount of voltage change (e.g., the difference between the voltage Vin1 and the voltage Vin2) of the first electrode of the first capacitor C1. That is, while the gate clock signal gclk has an enable voltage level, the difference voltage between the output signal RAMP[1] of the first delay circuit DC[1] and the output signal RAMP[64] of the 64-th delay circuit DC[64] may be output through the output terminal EC_OUT.

This difference voltage may be smaller in the second interval t2, where the output signal RAMP[1] of the first delay circuit DC[1] is smaller than the output signal RAMP [64] of the 64-th delay circuit DC[64], than in the first interval t1, where the output signal RAMP [1] of the first delay circuit DC[1] is larger than the output signal RAMP [64] of the 64-th delay circuit DC[64].

The comparator CPA may generate a comparison signal by comparing the voltage Vin1 of the first input terminal EC_IN1 and the voltage Vin2 of the second input terminal EC_IN1. For example, if the voltage Vin1 of the first input terminal EC_IN1 is greater than the voltage Vin2 of the second input terminal EC_IN1, the comparison signal may have a high voltage level, and if the voltage Vin1 of the first input terminal EC_IN1 is less than the voltage Vin2 of the second input terminal EC_IN1, the comparison signal may have a low voltage level. In other words, the comparison signal may have a high voltage level in the first interval t1, and the comparison signal may have a low voltage level in the second interval t2. Accordingly, in the first interval t1, the second predicted voltage PRED2 may be provided to the first terminal of the switch CSW5, and in the second interval t2, the first predicted voltage PRED1 may be provided to the first terminal of the switch CSW5.

The first predicted voltage PRED1 may be an idealized voltage difference between the output signal RAMP[1] of the first delay circuit DC[1] and the output signal RAMP[64] of the 64-th delay circuit DC[64] at the second interval t2. For example, the first predicted voltage PRED1 may be a preset value. For example, the first predicted voltage PRED1 may be an experimentally determined value.

The second predicted voltage PRED2 may be an idealized voltage difference between the output signal RAMP[1] of the first delay circuit DC[1] and the output signal RAMP[64] of the 64-th delay circuit DC[64] at the first interval t1. For example, the second predicted voltage PRED2 may be a preset value. For example, the second predicted voltage PRED2 may be an experimentally determined value.

Therefore, the difference between the voltage output to the output terminal EC_OUT when the gate clock signal gclk is at the enable voltage level and the voltage output to the output terminal EC_OUT when the invert gate clock signal gclkb is at the enable voltage level may be a voltage error value ER (see FIG. 16) to be compensated.

In the first interval t1, the voltage (e.g., the compensation control signal COMP) at the output terminal EC_OUT of the error compensator 522 may alternate between the voltage Vin1 and the difference between the voltage and the second prediction voltage PRED2. In the second interval t2, the voltage (e.g., the compensation control signal COMP) at the output terminal EC_OUT may alternate between the voltage Vin1 and the difference between the voltage Vin2 and the first predicted voltage PRED1.

For example, in the first interval t1, when the gate clock signal gclk has the enable voltage level, the voltage of the C node NC is applied to the output terminal EC_OUT of the error compensator 522, when the gate clock signal gclk has the disable voltage level (e.g., when the invert gate clock signal gclkb has the enable voltage level), a second predicted voltage PRED2 may be applied to the output terminal EC_OUT of the error compensator 522.

For example, in the second interval t2, when the gate clock signal gclk has the enable voltage level, the voltage of the C node NC is applied to the output terminal EC_OUT of the error compensator 522, When the gate clock signal gclk has the disable voltage level (e.g., when the invert gate clock signal gclkb has the enable voltage level), the first predicted voltage PRED1 may be applied to the output terminal EC_OUT of the error compensator 522.

Figure 15:
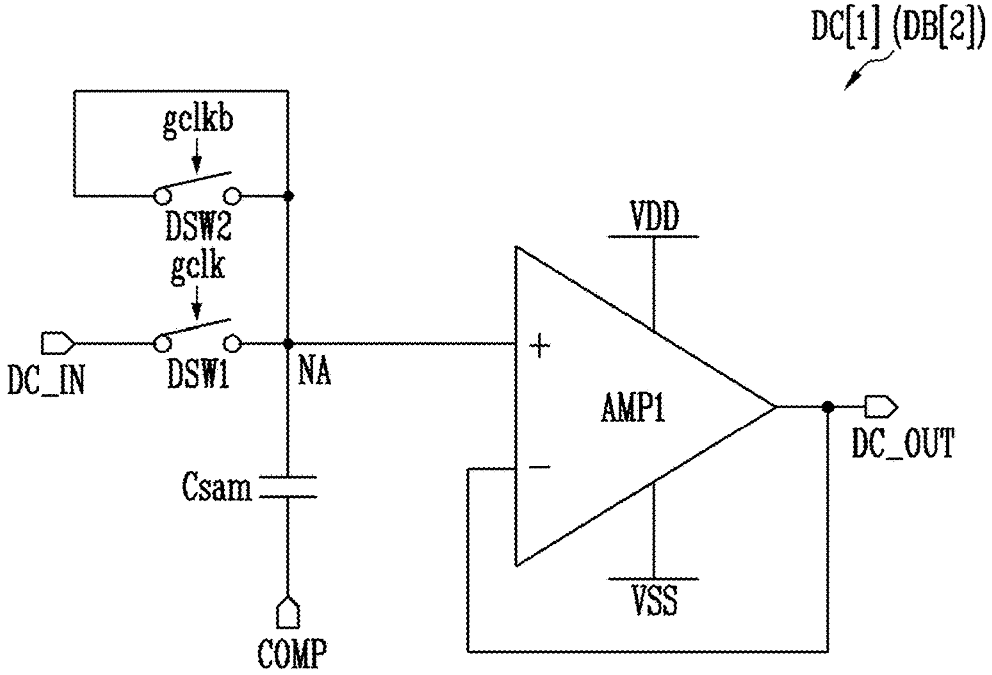
FIG. 15 is a schematic illustrating an example of the delay circuit of FIG. 9 in which a compensating control signal is applied.

FIG. 15 is a schematic illustrating an example of the delay circuit of FIG. 9 in which a compensating control signal is applied.

Referring to FIGS. 9 and 15, the first delay circuit DC[1] of each of the delay blocks DB, except for the first delay block DB[1], may receive a compensation control signal COMP. In FIG. 15, only the first delay circuit DC[1] of the second delay block DB[2] is illustrated, but the first delay circuit DC[1] of each of the delay blocks DB other than the first delay block DB[1] may be substantially the same as the first delay circuit DC[1] of FIG. 15.

Among the delay circuits DC, the first delay circuit DC[1] receiving the compensation control signal COMP may compensate the input signal in response to the compensation control signal COMP. For example, the first delay circuit DC[1] of the second delay block DB[2] may receive an output signal (e.g., a 64-th ramp signal RAMP[64]) of the first delay block DB[1], and may compensate the output signal of the 64-th delay circuit DC[64] of the first delay block DB[1] in response to the compensation control signal COMP generated in the first delay block DB[1].

The first delay circuit DC[1] of the second delay block DB[2] may comprise a first amplifier AMP1, switches DSW1, DSW2, and a sampling capacitor Csam. The first amplifier AMP1 may comprise a first input terminal, a second input terminal, and an output terminal coupled to the second input terminal. The switch DSW1 may comprise a first terminal connected to an input terminal DC_IN of the first delay circuit DC[1] of the second delay block DB[2], which is turned on in response to a gate clock signal gclk, and a second terminal connected to the first input terminal of the first amplifier AMP1. The switch DSW2 may turn on in response to the invert gate clock signal gclkb, and may comprise a first terminal connected to the A node NA and a second terminal connected to the A node NA. The sampling capacitor Csam may comprise a first electrode connected to a first input terminal of the first amplifier AMP1 and a second electrode receiving a compensation control signal COMP.

Figure 16:
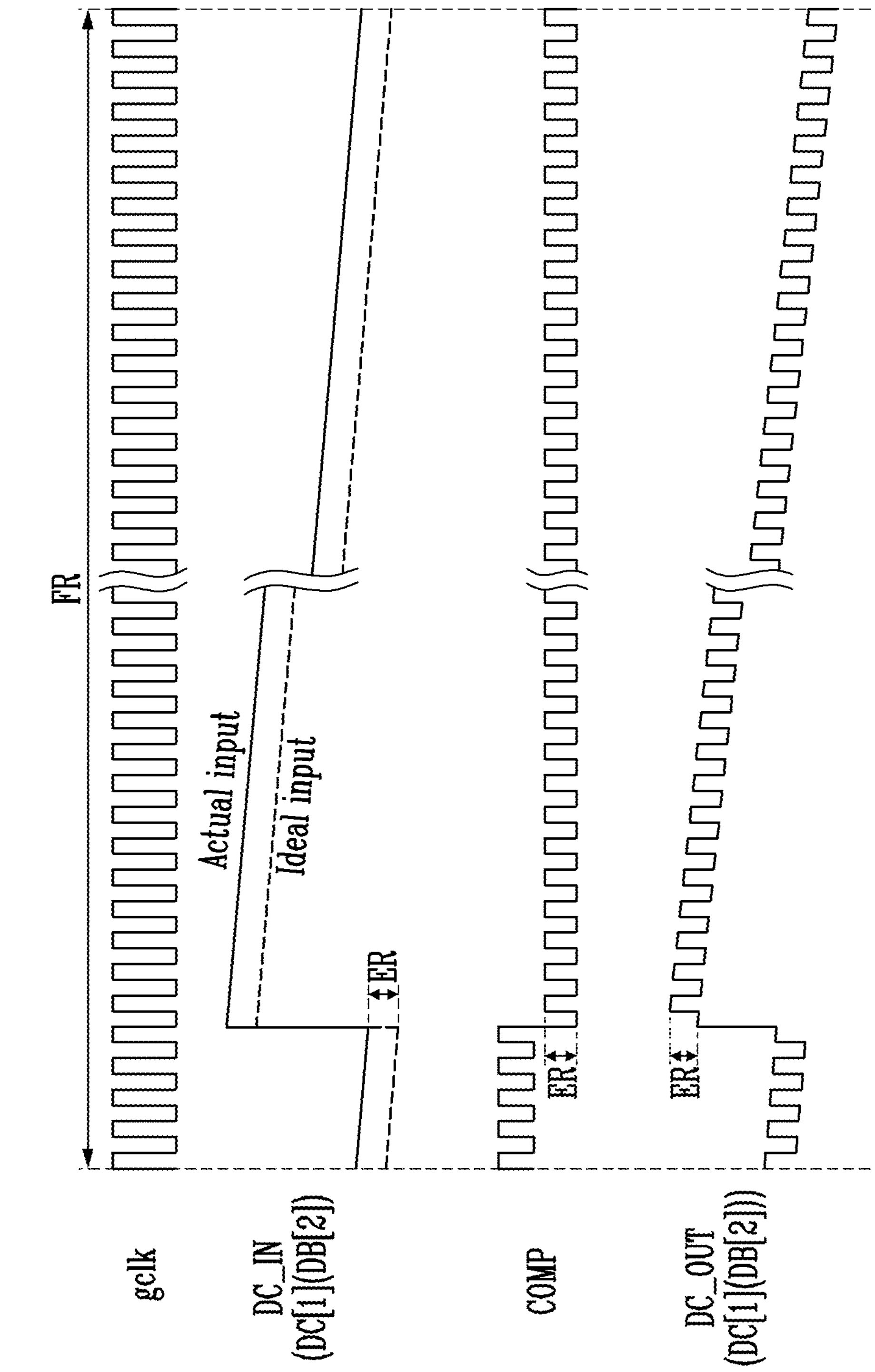
FIG. 16 is a timing diagram illustrating an example in which the delay circuit of FIG. 15 is driven.

FIG. 16 is a timing diagram illustrating an example in which the delay circuit of FIG. 15 is driven.

Referring to FIG. 9 and FIGS. 13 to 16, as the compensation control signal COMP is toggled by the voltage error value ER, the signal at the output terminal DC_OUT of the first delay circuit DC[1] of the second delay block DB[2]

may be toggled by the voltage error value ER. Then, the second delay circuit DC[2] of the second delay block DB[2] may receive the toggled signal of the output terminal DC_OUT of the first delay circuit DC[1] of the second delay block DB[2] as an input, and may delay and output a signal corresponding to the lower voltage of the toggled signal in response to the gate clock signal gclk. Accordingly, the ramp signal may be compensated by an error compensation value ER in each of the delay blocks DB. Here, the bottom voltage of the toggling signal refers to a voltage that is lowered when the toggling signal repeats the rising and falling.

Figure 17:
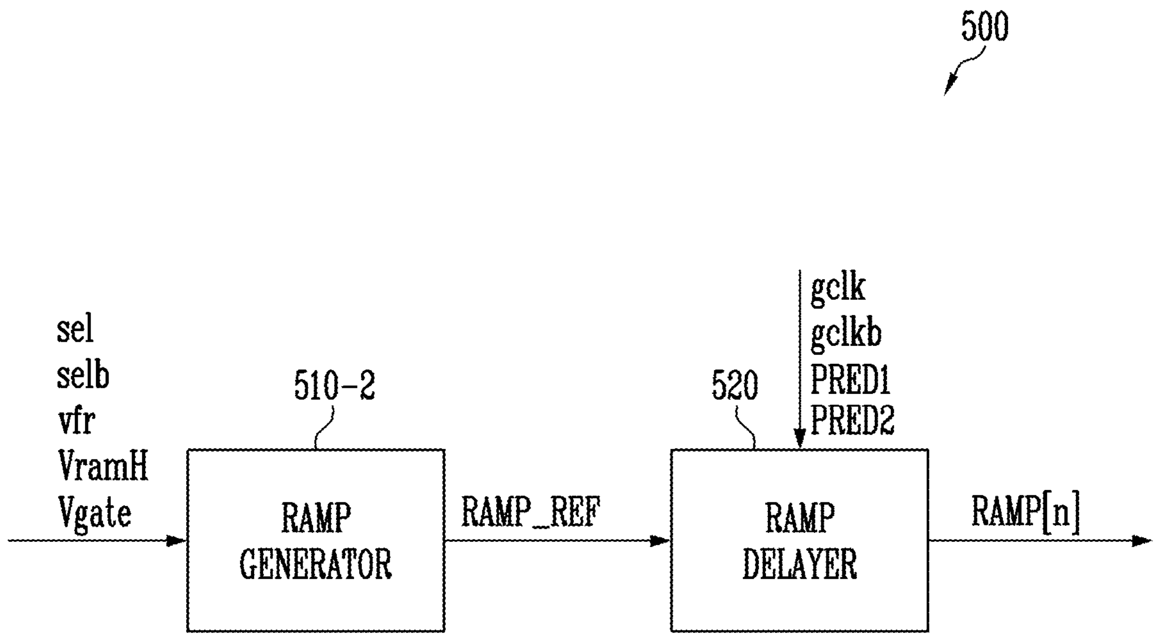
FIG. 17 is a diagram illustrating another example of the ramp driver of FIG. 1.

FIG. 17 is a diagram illustrating another example of the ramp driver of FIG. 1.

The ramp driver 500 according to embodiments is substantially the same as the configuration of the ramp driver 500 of FIG. 6, except for the ramp generators 510-2, and therefore, the same reference numbers and reference symbols are used for the same or similar components, and redundant descriptions are omitted.

Referring to FIGS. 1 and 17, the ramp driver 500 may comprise a ramp generator part 510-2 that generates a reference ramp signal RAMP_REF, and a ramp delayer 520 that outputs a sequence of ramp signals ( . . . , RAMP[n], . . . ).

The ramp generator 510-2 may receive a ramp control signal sel, an invert ramp control signal selb, a ramp select signal vfr, a high ramp voltage VramH, and a gate voltage Vgate, and may generate a reference ramp signal RAMP_REF.

The ramp control signal sel, the invert ramp control signal selb, and the ramp selection signal vfr may be comprised in the third control signal CONT3. For example, the invert ramp control signal selb may be a signal that inverts the ramp control signal sel.

In one or more embodiments, the high ramp voltage VramH may be provided to the ramp generator 510-2 from an external source of the display device. For example, the high ramp voltage VramH may be provided to the ramp generator 510-2 from a power management integrated circuit.

In other embodiments, the high ramp voltage VramH may be provided by the driving controller 200 or a power supply voltage generator inside the display device. For example, the driving controller 200 or power supply voltage generator may receive a reference power supply voltage from an external source to generate the high ramp voltage VramH and the low ramp voltage VramL.

The description of the gate voltage Vgate will be discussed later.

Figure 18:
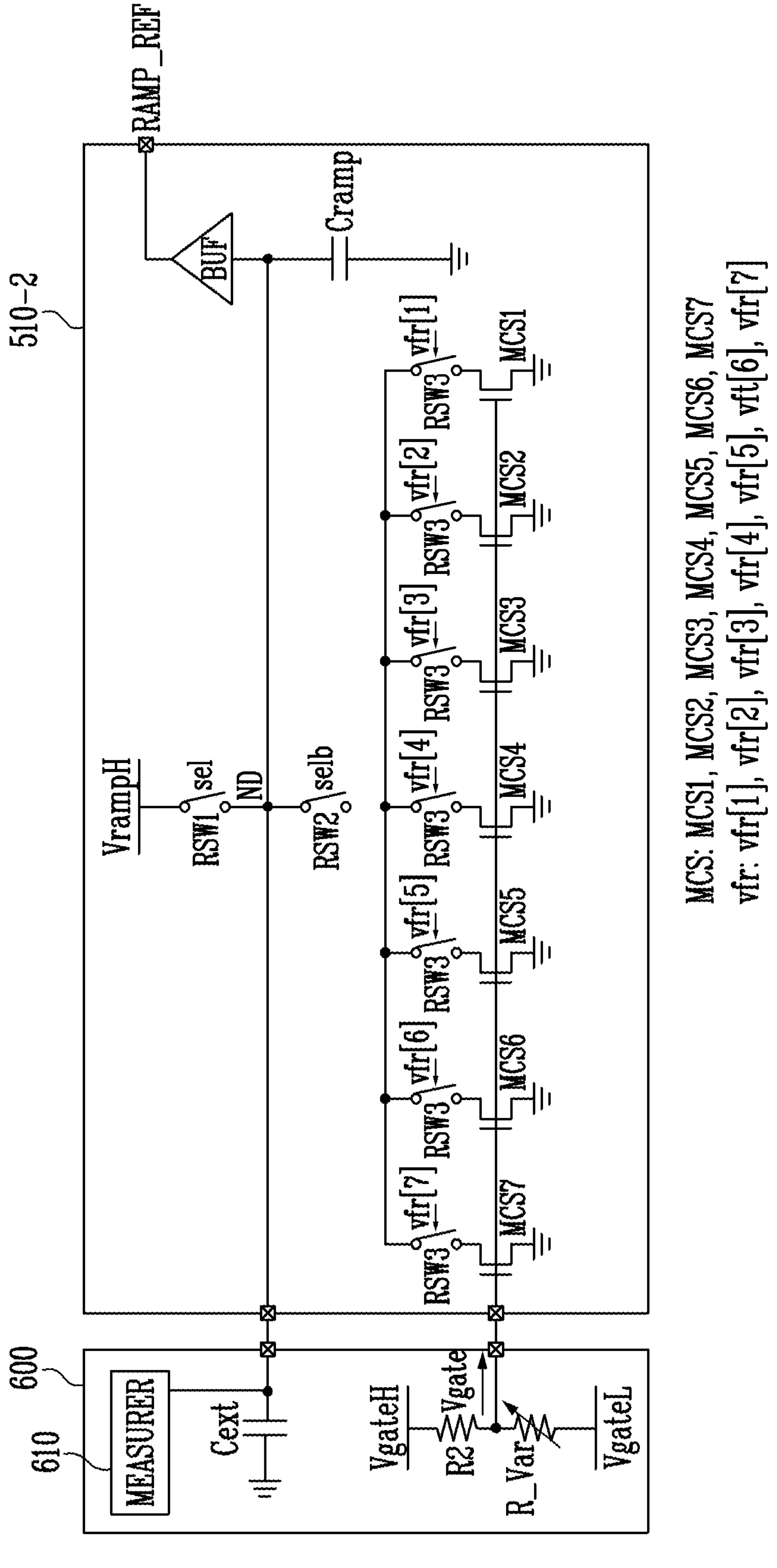
FIG. 18 is a block diagram illustrating an example of the ramp generator of FIG. 17.

FIG. 18 is a block diagram illustrating an example of the ramp generator of FIG. 17.

Referring to FIG. 18, the ramp generation section 510-2 may comprise ramp transistors MCS and ramp switches (RSW1 to RSW3). The first ramp switch RSW1 may comprise a first terminal that is turned on in response to the ramp control signal sel, where a high ramp voltage VrampH is applied, and a second terminal that is electrically connected to the output terminal of the ramp generator 510-2. The second ramp switch RSW2 may comprise a first terminal that is turned on in response to the invert ramp control signal selb, and a second terminal that is connected to the second terminal of the first ramp switch RSW1. The third ramp switches RSW3 may each comprise a first terminal connected to a second terminal of the second ramp switch RSW2, and a second terminal connected to one of the ramp transistors MCS. The third ramp switches RSW3 may be turned on in response to a ramp select signal vfr.

The ramp generator 510-2 may further comprise a buffer BUF and a ramp capacitor Cramp. The buffer BUF may be located between the D node ND to which the second terminal of the first ramp switch RSW1 is connected and the output terminal of the ramp generator 510-2. The ramp capacitor Cramp may comprise a first electrode connected to the D node ND, and a second electrode that is grounded.

The display device may further comprise an external circuit 600. The external circuit 600 may comprise a measurement portion 610 for measuring a voltage at the D node ND, and an output capacitor Cext connected to the D node ND. The external circuit 600 may further comprise a second resistor element R2 and a variable resistor element R_Var. The second resistor element R2 may comprise a first terminal that receives a high gate voltage VgateH, and a second terminal that is connected to the control electrodes of the ramp transistors MCS. The variable resistor element R_Var may comprise a first terminal connected to the control electrodes of the ramp transistors MCS, and a second terminal receiving a low gate voltage VgateL.

The voltage from the D node ND may charge the output capacitor Cext, and the measurement portion 610 may measure the voltage charged to the output capacitor Cext. In one or more embodiments, the driving controller 200 (see FIG. 1) may adjust the high ramp voltage VrampH based on the measured voltage. In this case, the high ramp voltage VrampH may be provided from the driving controller 200 or from a power voltage generator inside the display device. For example, the driving controller 200 (see FIG. 1) may increase the high ramp voltage VrampH when the reference ramp signal RAMP_REF is lower than the target voltage, and may decrease the high ramp voltage VrampH when the reference ramp signal RAMP_REF is higher than the target voltage. In other embodiments, an external device or user of the display device may adjust the high ramp voltage VrampH based on the measured voltage.

The external circuit 600 may provide a gate voltage Vgate to the control electrodes of the ramp transistors MCS. The gate voltage Vgate may be determined by the resistance value of the variable resistor element R_Var, the high gate voltage VgateH, and the low gate voltage VgateL. The driving controller 200 or a user may adjust the gate voltage Vgate by adjusting the resistance value of the variable resistor element R_Var, the high gate voltage VgateH, and the low gate voltage VgateL.

In one or more embodiments, the high gate voltage VgateH and the low gate voltage VgateL may be provided to the ramp generator 510-2 from an external source of the display device. For example, the high gate voltage VgateH and the low gate voltage VgateL may be provided to the ramp generator 510-2 from a power management integrated circuit.

In other embodiments, the high gate voltage VgateH and low gate voltage VgateL may be provided by the driving controller 200 or a power supply voltage generation section inside the display device. For example, the driving controller 200 or the power supply voltage generator may receive a reference power supply voltage from an external source to generate the high gate voltage VgateH and the low gate voltage VgateL.

Figure 19:
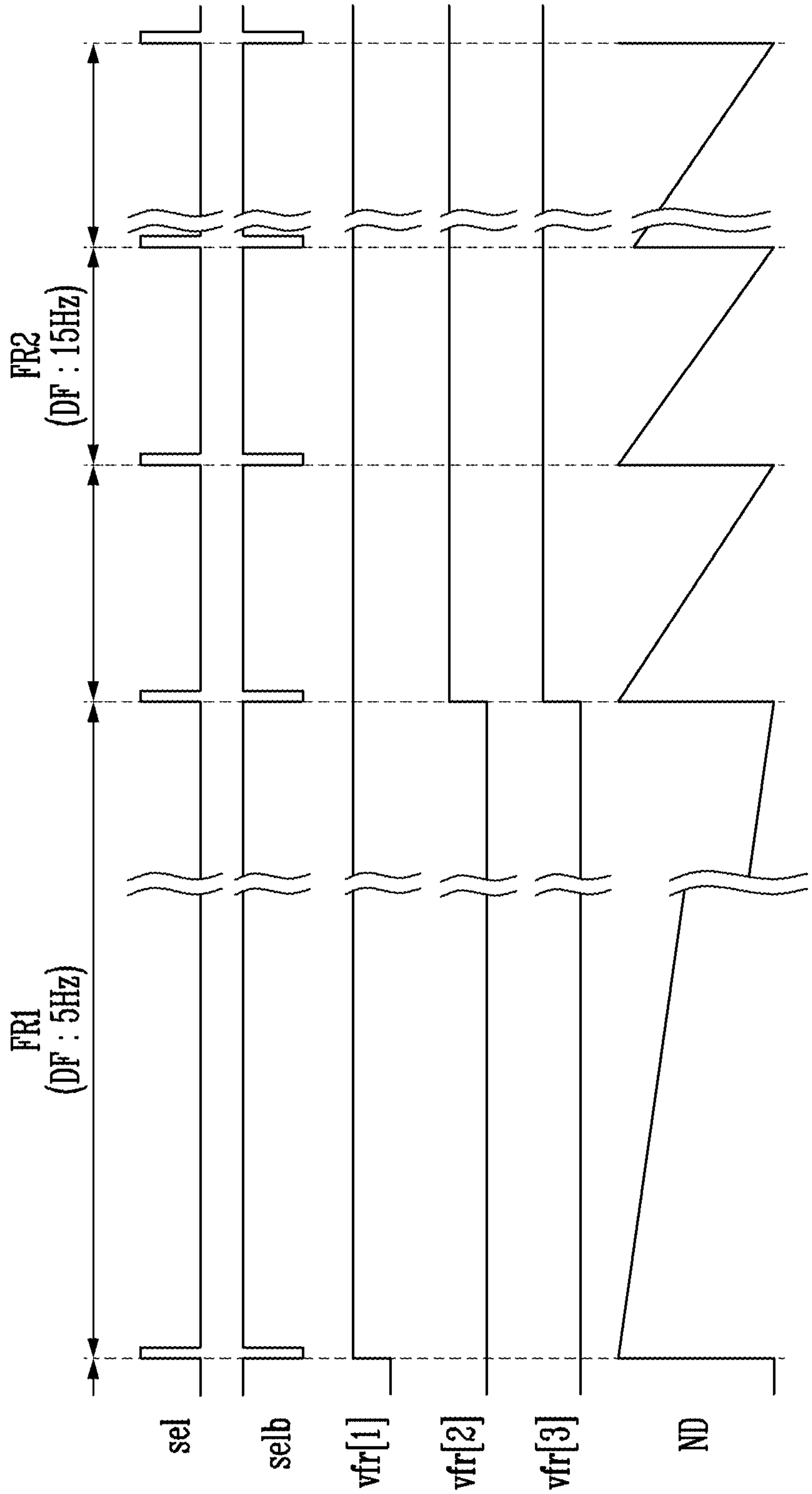
FIG. 19 is a timing diagram illustrating an example in which the ramp generator of FIG. 18 is driven.

FIG. 19 is a timing diagram illustrating an example in which the ramp generator of FIG. 18 is driven.

Referring to FIGS. 18 and 19, when the ramp control signal sel has an enable level, the first ramp switch RSW1 may be turned on, and a high ramp voltage VrampH may be applied to the D node ND. Then, when the invert ramp control signal selb has an enable level, the second ramp switch RSW2 may be turned on, and at least one of the third ramp switches RSW3 may be turned on. Accordingly, the voltage at the D node ND may decrease gradually. Accordingly, a reference ramp signal RAMP_REF may be generated.

In one or more embodiments, the slope of the reference ramp signal RAMP_REF may increase as the number of third ramp switches RSW3 turned on increases. For example, the greater the number of third ramp switches RSW3 that are turned on, the faster the voltage at the D node ND may be reduced. Accordingly, the slope of the reference ramp signal RAMP_REF may increase.

Depending on the length of each frame, the slope of the reference ramp signal RAMP_REF may be adjusted. For example, if the drive frequency DF of the first frame FR1 is about 5 Hz and the drive frequency DF of the second frame FR2 is about 15 Hz, only the first ramp selection signal vfr[1] may have an active level in the first frame FR1 and only the first to third ramp selection signals vfr[1] to vfr[3] may have an active level in the second frame FR2.

Figure 20:
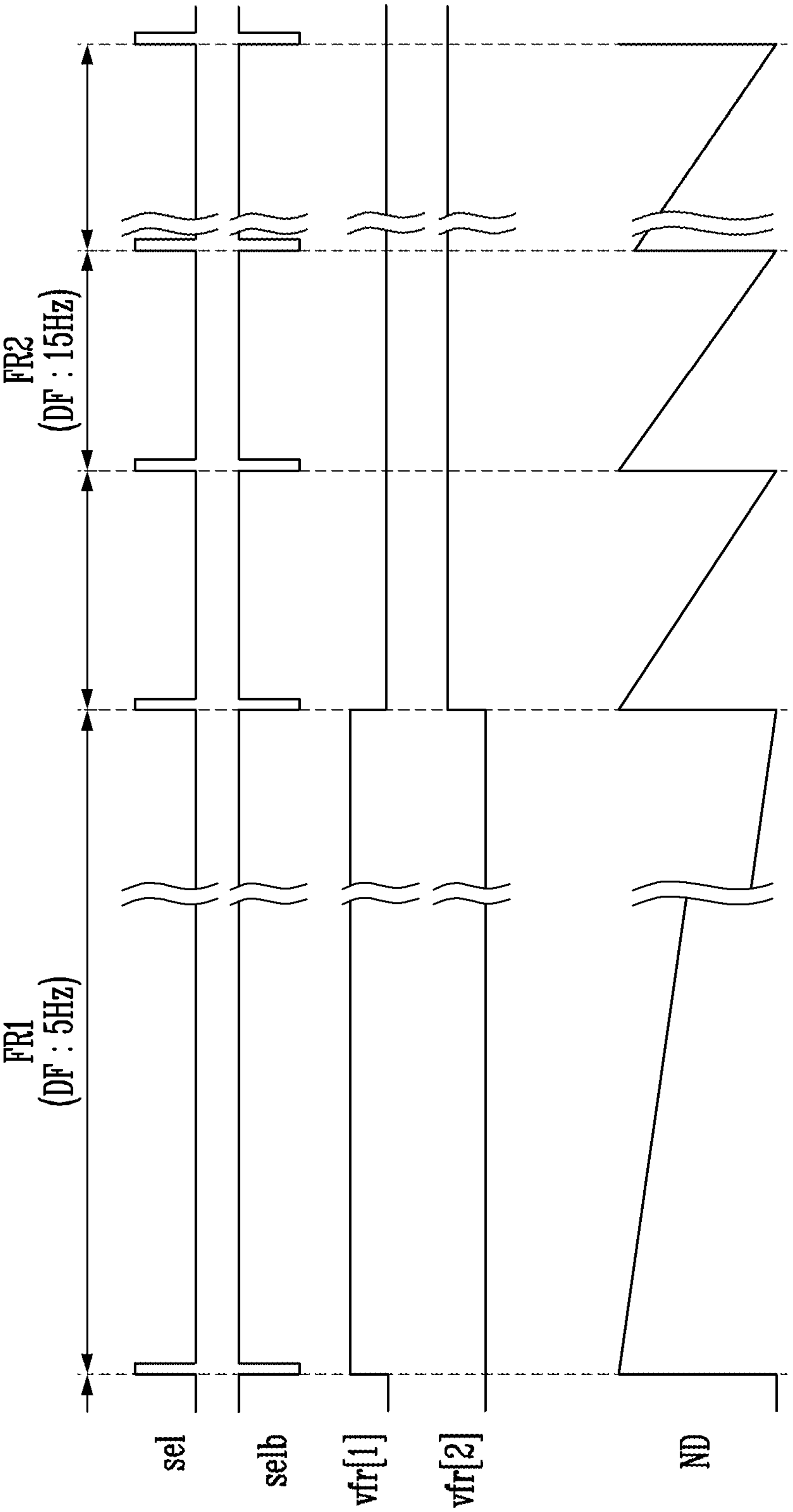
FIG. 20 is a timing diagram illustrating another example in which the ramp generator of FIG. 18 is driven.

FIG. 20 is a timing diagram illustrating another example of in which the ramp generator of FIG. 18 is driven.

Referring to FIGS. 18 and 20, the slope of the reference ramp signal RAMP_REF may vary depending on which third ramp switch RSW3 is turned on. Each of the third ramp switches RSW3 may have different channel widths. For example, the wider the channel width of the ramp transistor MCS being turned on, the greater the slope of the reference ramp signal RAMP_REF may be.

For example, if the drive frequency DF of the first frame FR1 is about 5 Hz, in the first frame FR1, the first ramp signal vfr[1] has an enable level and the first ramp transistor MCS1 may be turned on. For example, if the drive frequency DF of the second frame FR2 is about 15 Hz, then in the second frame FR2, the second ramp signal vfr[2] has an enable level and the second ramp transistor MCS2, which has a wider channel width than the first ramp transistor MCS1, may be turned on.

Figure 21:
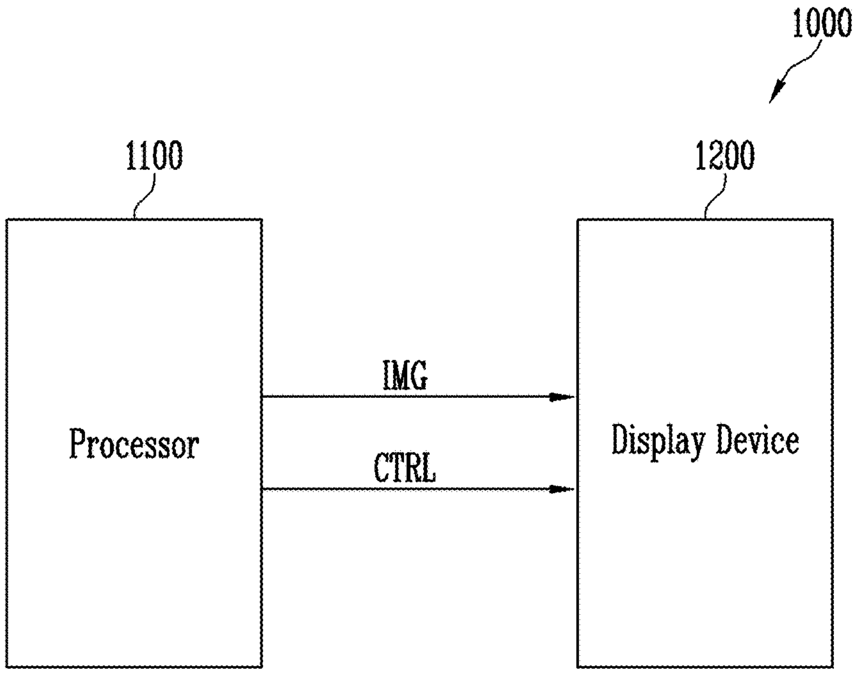
FIG. 21 is a block diagram illustrating one or more embodiments of a display system.

FIG. 21 is a block diagram illustrating one or more embodiments of a display system.

Referring to FIG. 21, the display system 1000 may comprise a processor 1100 and a display device 1200.

The processor 1100 may perform a variety of tasks and calculations. In embodiments, the processor 1100 may comprise an application processor, a graphics processor, a microprocessor, a central processing unit (CPU), or the like. The processor 1100 may be connected to other components of the display system 1000 via a bus system to control them.

The processor 1100 may transmit the image data IMG and control signals CTRL to the display device 1200. The display device 1200 may display the image based on the image data IMG and the control signal CTRL. The display device 1200 may be configured like the display device described with reference to FIG. 1. In such a case, the image data IMG and the control signal CTRL may be provided as the input image data IMG and control signal CONT of FIG. 1, respectively.

The display system 1000 may comprise a computing system that provides video display capabilities, such as a smart watch, mobile phone, smart phone, portable computer, tablet personal computer, watch phone, automotive display, smart glasses, portable multimedia player (PMP), navigation, ultra mobile personal computer (UMPC), or the like. The display system 1000 may also comprise at least one of a head-mounted display (HMD), a virtual reality (VR) device, a mixed reality (MR) device, or an augmented reality (AR) device.

FIGS. 22 to 25 are perspective views illustrating examples of applications of the display system of FIG. 21.

Figure 22:
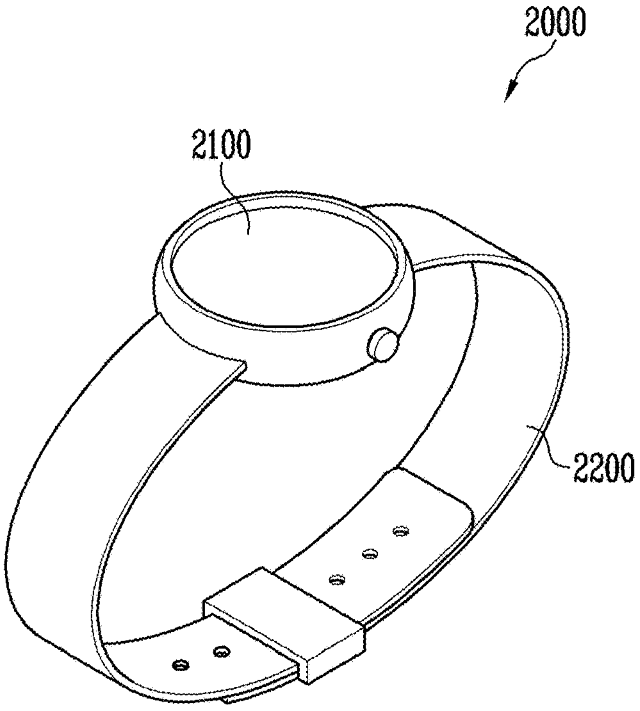
FIGS. 22 to 25 are perspective views illustrating examples of applications of the display system of FIG. 21.

Referring to FIG. 22, the display system 1000 of FIG. 21 may be applied to a smartwatch 2000 comprising a display portion 2100 and a strap portion 2200.

The smartwatch 2000 may be a wearable electronic device. For example, the smartwatch 2000 may have a strap portion 2200 that is mounted to a user's wrist. Here, the display portion 2100 may have the display system 1000 and/or display device 1200 applied to it, such that image data, comprising time information, may be provided to the user.

Figure 23:
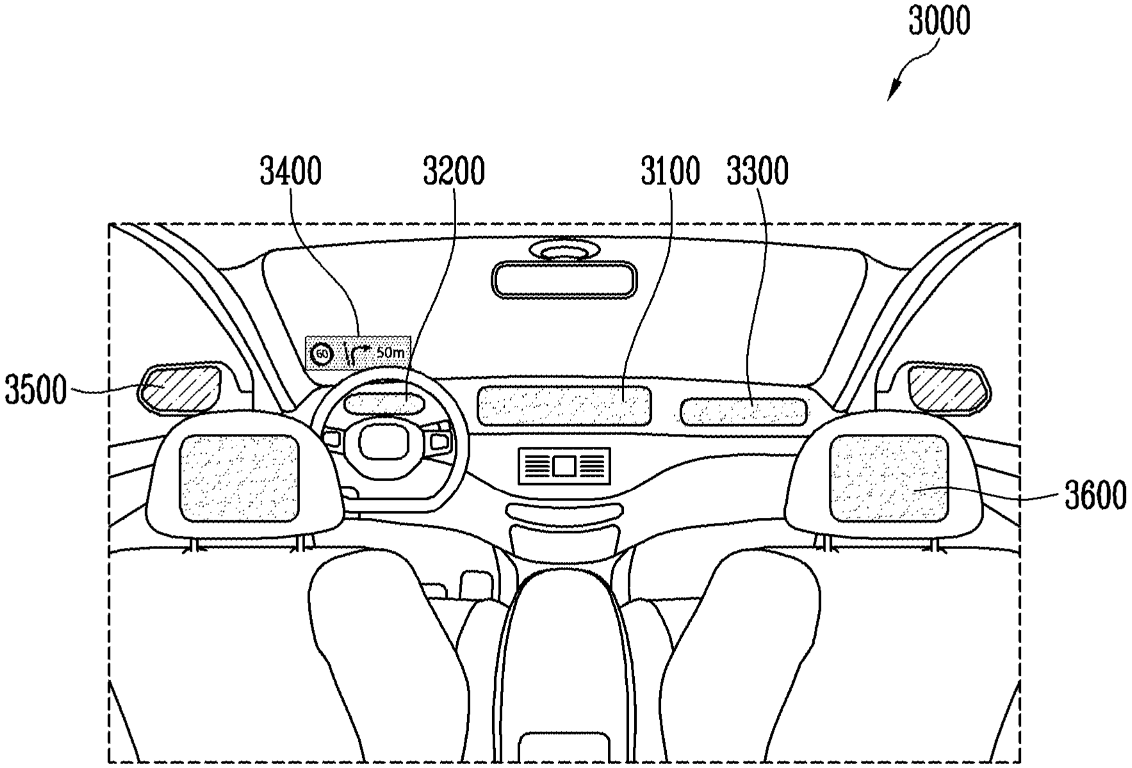

Referring now to FIG. 23, the display system 1000 of FIG. 21 may be adapted to an automotive display system 3000. Here, the automotive display system 3000 may comprise a computing system housed inside and/or outside the vehicle to provide video data.

For example, the display system 1000 and/or the display device 1200 may be applied to at least one of an infotainment panel 3100, a cluster 3200, a co-driver display 3300, a heads-up display 3400, a side mirror display 3500, or a rear-seat display 3600 in a vehicle.

Figure 24:
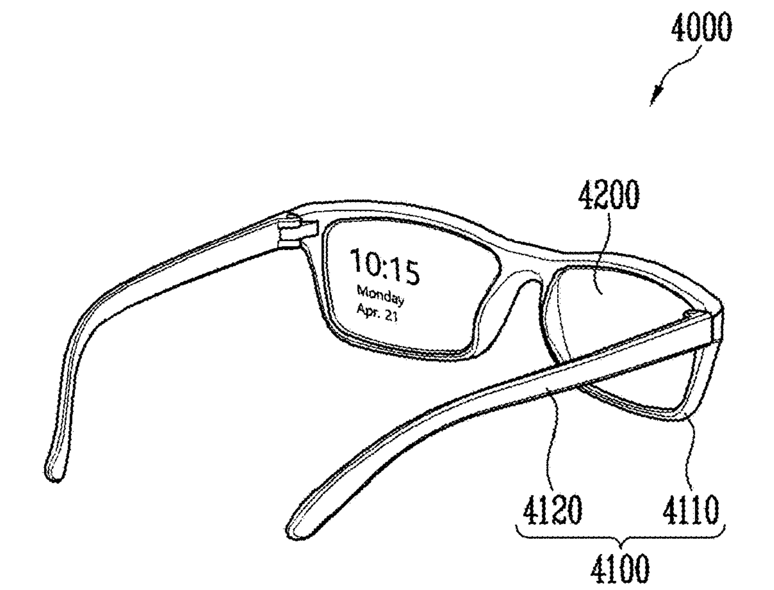

Referring to FIG. 24, the display system 1000 of FIG. 21 may be applied to smart glasses 4000. The smart glasses 4000 may be a wearable electronic device that may be worn on a user's head. For example, the smart glasses 4000 may be a wearable device for augmented reality.

The smart glasses 4000 may comprise a frame 4100 and a lens portion 4200. The frame 4100 may comprise a housing 4110 that supports the lens portion 4200 and a leg portion 4120 for wear by a user. The leg portion 4120 may be connected to the housing 4110 via a hinge, and may be foldable or unfoldable with respect to the housing 4110.

The frame 4100 may comprise a battery, a touch pad, a microphone, a camera, and the like. The frame 4100 may also comprise a projector to output light, a processor to control light signals, and the like.

The lens portion 4200 may comprise an optical member that transmits light or reflects light. For example, the lens portion 4200 may comprise glass, a transparent synthetic resin, or the like.

For the user's eyes to recognize the visual information, the lens portion 4200 may reflect the image caused by the light signal transmitted from the projector of the frame 4100 by a back side of the lens portion 4200 (e.g., a side facing the user's eyes). For example, a user may recognize visual information, such as time, date, etc. displayed on the lens portion 4200. In this case, the projector and/or lens portion 4200 may be a display device of some sort. The display device 1200 may be applied to the projector and/or lens portion 4200.

Figure 25:
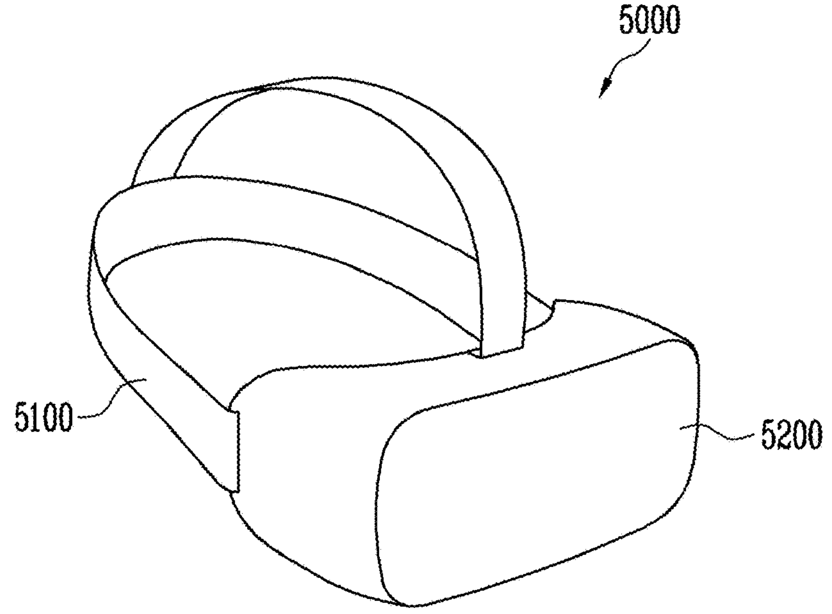

Referring now to FIG. 25, the display system 1000 of FIG. 21 may be adapted to a head-mounted display device 5000.

The head-mounted display device 5000 may be a wearable electronic device that may be worn on a user's head. For example, the head-mounted display device 5000 may be a wearable device for virtual reality or mixed reality.

The head-mounted display device 5000 may comprise a head-mounted band 5100 and a display device storage case 5200. The head-mounted band 5100 may be connected to the display device storage case 5200. The head-mounted band 5100 may comprise a horizontal band and/or a vertical band for securing the head-mounted display device 5000 to the head of a user. The horizontal band may be configured to wrap around a side portion of the user's head, and the vertical band may be configured to wrap around a top portion of the user's head. However, embodiments are not limited to these. For example, the head-mounted band 5100 may be implemented in the form of eyeglass frames, a helmet, or the like.

The display device storage case 5200 may house the display system 1000 and/or the display device 1200.

Although embodiments and applications have been described herein, they are provided for the purpose of providing a more general understanding of the present disclosure, the present disclosure is not limited to the embodiments and various modifications and variations may be made from these descriptions by one having ordinary skill in the field to which the present disclosure belongs.

Accordingly, the idea of the present disclosure is not to be limited to the described embodiments, and all equivalents or equivalent variations thereof, as well as the claims of the patent hereinafter described, will be the to fall within the scope of the idea of the present disclosure, with functional equivalents of the claims to be included therein.

What is claimed is:

1. A ramp driver comprising:

a ramp generator for generating a reference ramp signal; and a ramp delayer for sequentially outputting ramp signals based on the reference ramp signal, and comprising delay blocks comprising k output terminals, k being an integer greater than or equal to 2, wherein the delay blocks comprise k delay circuits sequentially connected to each other, respectively connected to the output terminals, and configured to:

receive an input ramp signal from a previous one of the delay circuits;

receive an input gate clock signal from a previous delay circuit;

output an output ramp signal by delaying the input ramp signal; and output an output gate clock signal by inverting the input gate clock signal.

2. The ramp driver of claim 1, wherein an initial delay circuit among the delay circuits is configured to generate the output ramp signal by delaying the reference ramp signal, and to generate the output gate clock signal by inverting a reference gate clock signal.

3. The ramp driver of claim 2, wherein the delay blocks comprise an error compensator for generating a compensation control signal by comparing the output ramp signal of a first delay circuit among the delay circuits in a corresponding delay block and the output ramp signal of a k-th delay circuit among the delay circuits in the corresponding delay block.

4. The ramp driver of claim 3, wherein the error compensator is configured to receive the reference gate clock signal.

5. The ramp driver of claim 4, wherein the error compensator is further configured to receive an invert gate clock signal, and comprises:

an amplifier comprising a first input terminal, a second input terminal for receiving a reference voltage, and an output terminal;

a first capacitor comprising a first electrode, and a second electrode connected to the first input terminal of the amplifier;

a second capacitor comprising a first electrode connected to the first input terminal of the amplifier, and a second electrode connected to an output terminal of the amplifier;

a first switch configured to be turned on in response to the invert gate clock signal, and comprising a first terminal connected to the first input terminal of the amplifier and a second terminal connected to the output terminal of the amplifier;

a second switch configured to be turned on in response to the reference gate clock signal, and comprising a first terminal connected to a first input terminal of the error compensator, and a second terminal connected to the first electrode of the first capacitor;

a third switch configured to be turned on in response to the invert gate clock signal, and comprising a first terminal connected to a second input terminal of the error compensator, and a second terminal connected to the first electrode of the first capacitor;

a fourth switch configured to be turned on in response to the reference gate clock signal, and comprising a first terminal connected to the output terminal of the amplifier, and a second terminal connected to an output terminal of the error compensator;

a comparator for outputting a comparison signal by comparing a signal of the first input terminal of the error compensator and a signal of the second input terminal of the error compensator;

a first transistor comprising a control electrode for receiving the comparison signal, a first electrode for receiving a first predicted voltage, and a second electrode;

a second transistor comprising a control electrode for receiving the comparison signal, a first electrode for receiving a second predicted voltage that is different from the first predicted voltage, and a second electrode; and a fifth switch configured to be turned on in response to the invert gate clock signal, and comprising a first terminal connected to the second electrode of the first transistor and to the second electrode of the second transistor, and a second terminal connected to the output terminal of the error compensator.

6. The ramp driver of claim 3, wherein the delay circuits comprise:

an amplifier;

a sampling capacitor comprising a first electrode connected to a first input terminal of the amplifier, and a second electrode for receiving a ground voltage or the compensation control signal;

an inverter for receiving the input gate clock signal, and for outputting the output gate clock signal; and a transmission gate connected between a delay circuit input terminal and the first input terminal of the amplifier, and configured to be controlled by the input gate clock signal and the output gate clock signal.

7. The ramp driver of claim 6, wherein the amplifier is configured to decrease a voltage at an output terminal of the amplifier based on a first bias voltage, and to increase the voltage at the output terminal of the amplifier based on a voltage at the first input terminal of the amplifier and a voltage at a second input terminal of the amplifier.

8. The ramp driver of claim 6, wherein the amplifier is configured to receive a first drive voltage, a second drive voltage, a first bias voltage, a second bias voltage, a third bias voltage, and a fourth bias voltage, and comprises:

a first P-type transistor comprising a first electrode for receiving the first drive voltage, and a control electrode for receiving the fourth bias voltage;

a second P-type transistor comprising a first electrode connected to a second electrode of the first P-type transistor, and a control electrode connected to the first input terminal of the amplifier;

a third P-type transistor comprising a first electrode connected to the second electrode of the first P-type transistor, and a control electrode connected to a second input terminal of the amplifier;

a fourth P-type transistor comprising a first electrode for receiving the first drive voltage;

a fifth P-type transistor comprising a first electrode for receiving the first drive voltage, and a control electrode connected to a control electrode of the fourth P-type transistor;

a sixth P-type transistor comprising a first electrode connected to a second electrode of the fourth P-type transistor, a second electrode connected to the control electrode of the fourth P-type transistor, and a control electrode for receiving the third bias voltage;

a seventh P-type transistor comprising a first electrode connected to a second electrode of the fifth P-type transistor, and a control electrode for receiving the third bias voltage;

an eighth P-type transistor comprising a first electrode for receiving the first drive voltage, a second electrode connected to an output terminal of the amplifier, and a control electrode connected to a second electrode of the seventh P-type transistor;

a capacitor comprising a first electrode connected to a second electrode of the fifth P-type transistor, and a second electrode connected to the output terminal of the amplifier;

a first N-type transistor comprising a first electrode connected to the second electrode of the third P-type transistor, a second electrode for receiving the second drive voltage, and a control electrode for receiving the first bias voltage;

a second N-type transistor comprising a first electrode connected to a second electrode of the second P-type transistor, a second electrode for receiving the second drive voltage, and a control electrode for receiving the first bias voltage;

a third N-type transistor comprising a first electrode connected to the control electrode of the fourth P-type transistor, a second electrode connected to a second electrode of the third P-type transistor, and a control electrode for receiving the second bias voltage;

a fourth N-type transistor comprising a first electrode connected to the control electrode of the eighth P-type transistor, a second electrode connected to a second electrode of the second P-type transistor, and a control electrode for receiving the second bias voltage; and a fifth N-type transistor comprising a first electrode connected to the output terminal of the amplifier, a second electrode for receiving the second drive voltage, and a control electrode for receiving the first bias voltage.

9. The ramp driver of claim 1, wherein the ramp generator comprises a resistor string between a first terminal for receiving a high ramp voltage and a second terminal for receiving a low ramp voltage, wherein the resistor string partitions the high ramp voltage into first to p-th voltages, p being a positive integer, and wherein the ramp generator is configured to output the first to p-th voltages sequentially to generate the reference ramp signal.

10. The ramp driver of claim 9, wherein the ramp generator further comprises stages comprising:

a flip-flop for outputting a ramp control signal;

a ramp switch comprising a first terminal connected to a corresponding first resistive element of the resistor string, and a second terminal connected to an output terminal of the ramp generator; and a level shifter for turning on the ramp switch upon receiving the ramp control signal.

11. An electronic device comprising:

a processor for providing an image data; and a display device for displaying an image based on the image data, and comprising:

a display panel comprising pixels; and a ramp driver for generating ramp signals provided to the pixels, and comprising:

a ramp generator for generating a reference ramp signal; and a ramp delayer for sequentially outputting the ramp signals based on the reference ramp signal, and comprising delay blocks comprising k output terminals, k being an integer greater than or equal to 2, wherein the delay blocks comprise k delay circuits sequentially connected to each other, respectively connected to the output terminals, and configured to:

receive an input ramp signal from a previous one of the delay circuits;

receive an input gate clock signal from a previous delay circuit;

output an output ramp signal by delaying the input ramp signal; and output an output gate clock signal by inverting the input gate clock signal.

12. The electronic device of claim 11, wherein an initial delay circuit among the delay circuits is configured to generate the output ramp signal by delaying the reference ramp signal, and wherein the initial delay circuit is configured to generate the output gate clock signal by inverting a reference gate clock signal.

13. The electronic device of claim 12, wherein the delay blocks comprise an error compensator for generating a compensation control signal by comparing the output ramp signal of a first delay circuit among the delay circuits in a corresponding delay block and the output ramp signal of a k-th delay circuit among the delay circuits in the corresponding delay block.

14. The electronic device of claim 13, wherein the error compensator is configured to receive the reference gate clock signal.

15. The electronic device of claim 14, wherein the error compensator is further configured to receive an invert gate clock signal, and comprises:

an amplifier comprising a first input terminal, a second input terminal for receiving a reference voltage, and an output terminal;

a first capacitor comprising a first electrode, and a second electrode connected to the first input terminal of the amplifier;

a second capacitor comprising a first electrode connected to the first input terminal of the amplifier, and a second electrode connected to an output terminal of the amplifier;

a first switch configured to be turned on in response to the invert gate clock signal, and comprising a first terminal connected to the first input terminal of the amplifier, and a second terminal connected to the output terminal of the amplifier;

a second switch configured to be turned on in response to the reference gate clock signal, and comprising a first terminal connected to a first input terminal of the error compensator, and a second terminal connected to the first electrode of the first capacitor;

a third switch configured to be turned on in response to the invert gate clock signal, and comprising a first terminal connected to a second input terminal of the error compensator, and a second terminal connected to the first electrode of the first capacitor;

a fourth switch configured to be turned on in response to the reference gate clock signal, comprising a first terminal connected to the output terminal of the amplifier, and a second terminal connected to an output terminal of the error compensator;

a comparator for outputting a comparison signal by comparing a signal of the first input terminal of the error compensator and a signal of the second input terminal of the error compensator;

a first transistor comprising a control electrode for receiving the comparison signal, a first electrode for receiving a first predicted voltage, and a second electrode;

a second transistor comprising a control electrode for receiving the comparison signal, a first electrode for receiving a second predicted voltage that is different from the first predicted voltage, and a second electrode; and a fifth switch configured to be turned on in response to the invert gate clock signal, and comprising a first terminal connected to the second electrode of the first transistor and to the second electrode of the second transistor, and a second terminal connected to the output terminal of the error compensator.

16. The electronic device of claim 13, wherein the delay circuits comprise:

an amplifier;

a sampling capacitor comprising a first electrode connected to a first input terminal of the amplifier, and a second electrode for receiving a ground voltage or the compensation control signal;

an inverter for receiving the input gate clock signal, and for outputting the output gate clock signal inverted from the input gate clock signal; and a transmission gate connected between a delay circuit input terminal and the first input terminal of the amplifier, and configured to be controlled by the input gate clock signal and the output gate clock signal.

17. The electronic device of claim 16, wherein the amplifier is configured to decrease a voltage at an output terminal of the amplifier based on a first bias voltage, and to increase the voltage at the output terminal of the amplifier based on a voltage at the first input terminal of the amplifier and a voltage at a second input terminal of the amplifier.

18. The electronic device of claim 16, wherein the amplifier is configured to receive a first drive voltage, a second drive voltage, a first bias voltage, a second bias voltage, a third bias voltage, and a fourth bias voltage, and comprises:

a first P-type transistor comprising a first electrode for receiving the first drive voltage, and a control electrode for receiving the fourth bias voltage;

a second P-type transistor comprising a first electrode connected to a second electrode of the first P-type transistor, and a control electrode connected to the first input terminal of the amplifier;

a third P-type transistor comprising a first electrode connected to the second electrode of the first P-type transistor, and a control electrode connected to a second input terminal of the amplifier;

a fourth P-type transistor comprising a first electrode for receiving the first drive voltage;

a fifth P-type transistor comprising a first electrode for receiving the first drive voltage, and a control electrode connected to a control electrode of the fourth P-type transistor;

a sixth P-type transistor, a first electrode connected to a second electrode of the fourth P-type transistor, a second electrode connected to the control electrode of the fourth P-type transistor, and a control electrode for receiving the third bias voltage;

a seventh P-type transistor comprising a first electrode connected to a second electrode of the fifth P-type transistor, and a control electrode for receiving the third bias voltage;

an eighth P-type transistor comprising a first electrode for receiving the first drive voltage, a second electrode connected to an output terminal of the amplifier, and a control electrode connected to a second electrode of the seventh P-type transistor;

a capacitor comprising a first electrode connected to a second electrode of the fifth P-type transistor, and a second electrode connected to the output terminal of the amplifier;

a first N-type transistor comprising a first electrode connected to a second electrode of the third P-type transistor, a second electrode for receiving the second drive voltage, and a control electrode for receiving the first bias voltage;

a second N-type transistor comprising a first electrode connected to a second electrode of the second P-type transistor, a second electrode for receiving the second drive voltage, and a control electrode for receiving the first bias voltage;

a third N-type transistor comprising a first electrode connected to a control electrode of the fourth P-type transistor, a second electrode connected to a second electrode of the third P-type transistor, and a control electrode for receiving the second bias voltage;

a fourth N-type transistor comprising a first electrode connected to the control electrode of the eighth P-type transistor, a second electrode connected to a second electrode of the second P-type transistor, and a control electrode for receiving the second bias voltage; and a fifth N-type transistor comprising a first electrode connected to the output terminal of the amplifier, a second electrode for receiving the second drive voltage, and a control electrode for receiving the first bias voltage.

19. The electronic device of claim 11, wherein the ramp generator comprises a resistor string between a first terminal for receiving a high ramp voltage, and a second terminal for receiving a low ramp voltage, wherein the resistor string partitions the high ramp voltage into first to p-th voltages, wherein p is a positive integer, and wherein the ramp generator is configured to output the first to p-th voltages sequentially to generate the reference ramp signal.

20. The electronic device of claim 19, wherein the ramp generator further comprises stages, the stages comprising:

a flip-flop for outputting a ramp control signal;

a ramp switch comprising a first terminal connected to a corresponding first resistive element of the resistor string, and a second terminal connected to an output terminal of the ramp generator; and a level shifter for turning on the ramp switch upon receiving the ramp control signal.

* * * * *